United States Patent
Fujii et al.

(10) Patent No.: US 7,449,372 B2
(45) Date of Patent: Nov. 11, 2008

(54) MANUFACTURING METHOD OF SUBSTRATE HAVING CONDUCTIVE LAYER AND MANUFACTURING METHOD OF SEMICONDUCTOR DEVICE

(75) Inventors: Gen Fujii, Kanagawa (JP); Masafumi Morisue, Kanagawa (JP); Hironobu Shoji, Tokyo (JP); Junya Maruyama, Kanagawa (JP); Kouji Dairiki, Kanagawa (JP); Tomoyuki Aoki, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 247 days.

(21) Appl. No.: 11/295,471

(22) Filed: Dec. 7, 2005

(65) Prior Publication Data
US 2006/0134918 A1    Jun. 22, 2006

(30) Foreign Application Priority Data
Dec. 17, 2004    (JP)    ............................. 2004-366595

(51) Int. Cl.
    H01L 21/84    (2006.01)
(52) U.S. Cl. ................. 438/149; 48/795; 257/E21.259; 257/E21.266; 257/E21.493
(58) Field of Classification Search .......... 257/E21.259, 257/E21.266, E21.493; 438/149
See application file for complete search history.

(56) References Cited

U.S. PATENT DOCUMENTS

| 6,734,029 B2 | 5/2004 | Furusawa |
| 6,861,279 B2 * | 3/2005 | Nakanishi et al. ............. 438/69 |
| 7,018,872 B2 * | 3/2006 | Hirai et al. .................. 438/149 |
| 2002/0151161 A1 | 10/2002 | Furusawa |
| 2005/0112810 A1 | 5/2005 | Kobayashi |

FOREIGN PATENT DOCUMENTS

| JP | 2003-209339 | 7/2003 |
| JP | 2004-087977 | 3/2004 |

* cited by examiner

Primary Examiner—Michael S. Lebentritt
Assistant Examiner—Chakila Tillie
(74) Attorney, Agent, or Firm—Nixon Peabody LLP; Jeffrey L. Costellia

(57) ABSTRACT

The manufacturing method of a substrate having a conductive layer has the steps of: forming an inorganic insulating layer over a substrate; forming an organic resin layer with a desired shape over the inorganic insulating layer; forming a low wettability layer with respect to a composition containing conductive particles on a first exposed portion of the inorganic insulating layer; removing the organic resin layer; and coating a second exposed portion of the inorganic insulating layer with a composition containing conductive particles and baking, thereby forming a conductive layer.

18 Claims, 17 Drawing Sheets

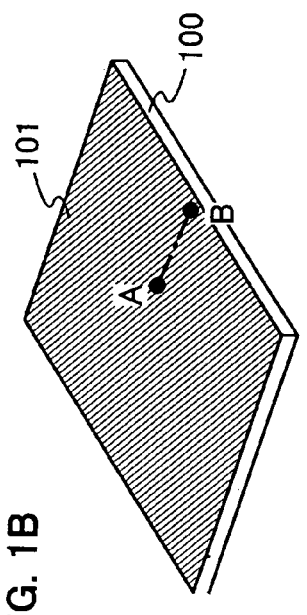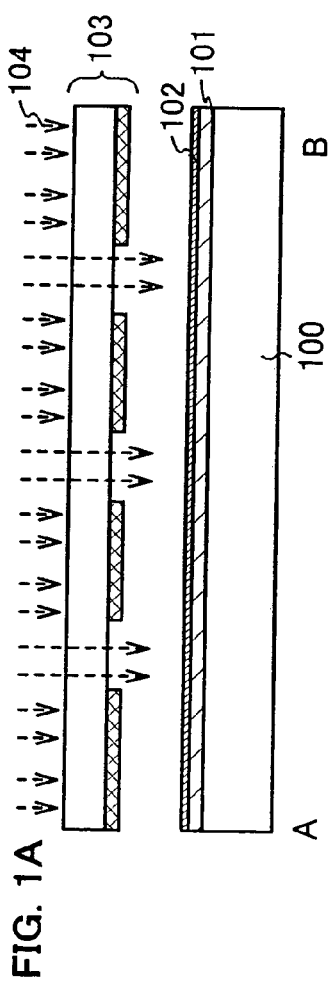
FIG. 1A  FIG. 1B
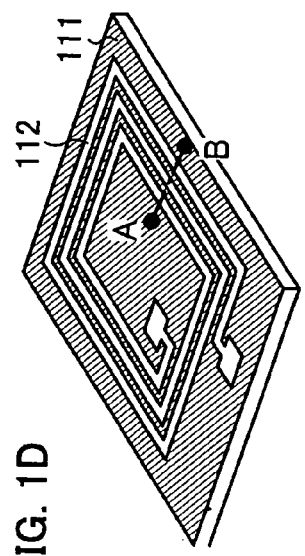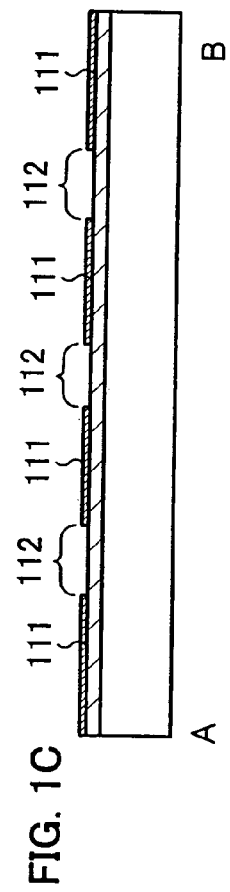
FIG. 1C  FIG. 1D
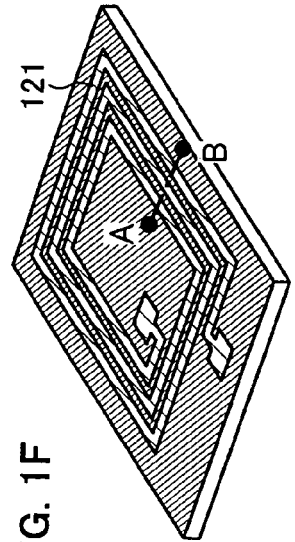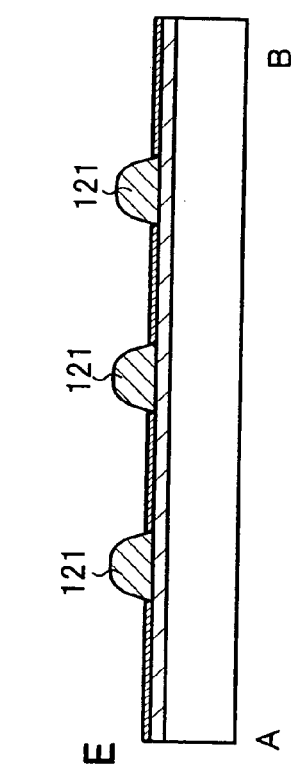
FIG. 1E  FIG. 1F

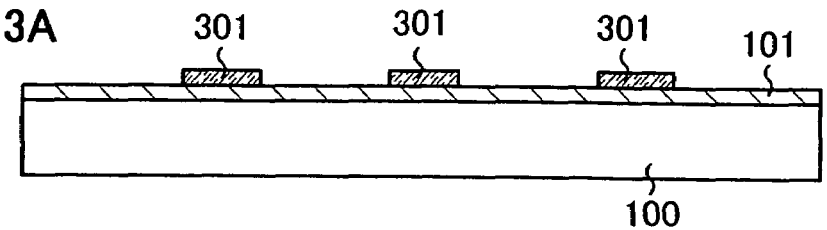
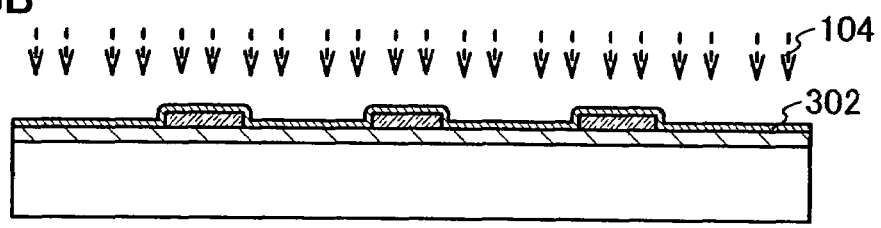
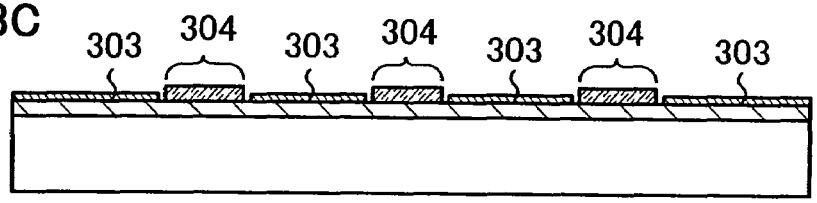
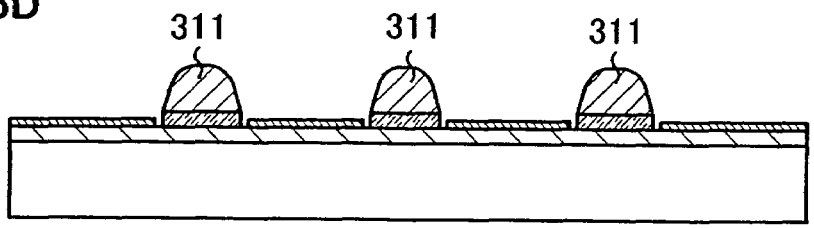

MANUFACTURING METHOD OF SUBSTRATE HAVING CONDUCTIVE LAYER AND MANUFACTURING METHOD OF SEMICONDUCTOR DEVICE

BACKGROUND OF THE INVENTION

1. Field of the Invention

The present invention relates to a substrate having a conductive layer such as a wire and an antenna, which is provided in a semiconductor device such as a wireless chip, a wireless tag, a wireless IC, an RFID and an IC tag and used for communicating data bi-directionally and wirelessly, and to a manufacturing method thereof. The invention also relates to a manufacturing method of a semiconductor device having an antenna for communicating data bi-directionally and wirelessly.

2. Description of the Related Art

In recent years, ICs having a function of communicating data wirelessly have been actively developed, such as a wireless tag, an IC tag and a contactless IC card. The IC tag and the contactless IC card require an antenna for communicating data wirelessly. The antenna is formed by embedding a coil of wire, printing, etching of a conductive thin film, plating or the like. Above all, the printing is widely adopted because of its high throughput.

Electromotive force generated when an antenna resonates with a reader/writer depends on number of windings, area and the like of a coil of an antenna, a frequency of electromagnetic wave communicated between an antenna and a reader/writer, and the like. A frequency at which an electromotive force is large is called resonant frequency, which depends on an inductance and a capacitance of a coil. The inductance of a coil depends on a form of the coil, such as size, shape, number of windings, and distance between adjacent coils. In particular, the inductance of a coil is proportional to the length of a coil and inversely proportional to a distance between adjacent coils.

When a print with conductive paste is conducted on a substrate by screen printing, however, the conductive paste filling in an opening of a mask spreads from the opening, which causes overflow. The overflow of the conductive paste from the opening of the mask makes a peripheral region (edge portion) 1602 of a conductive paste 1601 have a small taper angle as shown in a cross sectional view of a conductive paste in FIG. 16A. A conductive layer formed by baking such a conductive paste is short-circuited with an adjacent layer, leading to reduced yield.

Further in screen printing, conductive pastes filling in openings of a mesh mask are connected to each other to be a line paste. Accordingly, a distance 1613 between adjacent conductive pastes differs, as shown in a top plan view of a conductive paste in FIG. 16B, between a region 1611 of a paste filling in an opening and regions 1612 of the paste connecting to the region 1611. When a conductive layer is formed by baking such conductive pastes to be used as an antenna, the inductance of the antenna is different from that in the case that a distance between adjacent conductive pastes is constant, and lower resonant frequency is obtained, leading to lower electromotive force.

In the regions 1612 with a narrow line width of the conductive paste, the conductive paste is easily separated, which results in lower yield. In addition, depending on the viscosity of the conductive paste, resistance increases because of the thinness of the conductive layer. Several times of prints of conductive paste may be conducted in order to avoid such problems; however, in this case, the number of steps increases and adjacent conductive pastes are connected to each other, which causes a short circuit of conductive layers formed later.

SUMMARY OF THE INVENTION

In view of the foregoing, the invention provides a manufacturing method of a substrate having conductive layers, which is capable of controlling the distance between adjacent conductive layers. The invention also provides a manufacturing method of a substrate having a thick conductive layer with a narrow width, which is capable of controlling the width and thickness of the conductive layer. Further, the invention provides a manufacturing method of a substrate having a conductive layer functioning as an antenna with small variations in inductance and a large electromotive force. Still further, the invention provides a manufacturing method of a semiconductor device with high yield.

According to the invention, a low wettability region with respect to a composition containing conductive particles and a high wettability region with respect to a composition containing conductive particles are formed over a substrate, and the high wettability region is coated with a composition containing conductive particles and baked, thereby forming a conductive layer.

According to one mode of the invention, a low wettability layer with respect to a composition containing conductive particles is formed over a substrate, a part of the low wettability layer is irradiated with light to form a high wettability region, and the high wettability region is coated with a composition containing conductive particles and baked, thereby forming a conductive layer.

According to one mode of the invention, a photocatalytic layer is formed over a substrate, a low wettability layer with respect to a composition containing conductive particles is formed on the photocatalytic layer, a part of the low wettability layer is irradiated with light to form a high wettability region, and the high wettability region is coated with a composition containing conductive particles and baked, thereby forming a conductive layer.

According to one mode of the invention, a photocatalytic layer having a desired shape is formed over a substrate, a low wettability layer with respect to a composition containing conductive particles is formed over the photocatalytic layer having a desired shape, the low wettability layer is irradiated with light to form a high wettability region, and the high wettability region is coated with a composition containing conductive particles and baked, thereby forming a conductive layer.

According to one mode of the invention, an inorganic insulating layer is formed over a substrate, an organic resin layer having a desired shape is formed over the inorganic insulating layer, a low wettability layer with respect to a composition containing conductive particles is formed on a first exposed portion of the inorganic insulating layer, which is not covered by the organic resin layer, and after the organic resin layer is removed, the first exposed portion of the inorganic insulating layer, which is not covered by the low wettability layer with respect to the composition containing conductive particles, is coated with the composition containing conductive particles and baked, thereby forming a conductive layer.

According to one mode of the invention, an organic resin layer is formed over a substrate, an inorganic insulating layer having a desired shape is formed over the organic resin layer, a low wettability layer with respect to a composition containing conductive particles is formed over the surface of the inorganic insulating layer, and the organic resin layer is coated with a composition containing conductive particles and baked, thereby forming a conductive layer.

According to one mode of the invention, a semiconductor element is formed over a substrate, an insulating layer is formed to cover the semiconductor element and expose a part of a conductive layer that is connected to a source region or a drain region of the semiconductor element, a low wettability region with respect to a composition containing conductive particles and a high wettability region with respect to a composition containing conductive particles are formed over the insulating layer and the exposed conductive layer, and the high wettability region is coated with a composition containing conductive particles and baked, thereby forming a conductive layer.

According to one mode of the invention, a semiconductor element is formed over a substrate, an insulating layer is formed to cover the semiconductor element and expose a part of a conductive layer that is connected to a source region or a drain region of the semiconductor element, a low wettability layer with respect to a composition containing conductive particles is formed over the insulating layer and the exposed conductive layer, a part of the low wettability layer is irradiated with light to form a high wettability region with respect to a composition containing conductive particles, and the high wettability region is coated with a composition containing conductive particles and baked, thereby forming a conductive layer.

According to one mode of the invention, a semiconductor element is formed over a substrate, an inorganic insulating layer is formed to cover the semiconductor element and expose a part of a conductive layer that is connected to a source region or a drain region of the semiconductor element, an organic resin layer having a desired shape is formed over the inorganic insulating layer and the exposed conductive layer, a low wettability layer with respect to a composition containing conductive particles is formed on the exposed portion of the inorganic insulating layer, which is not covered by the organic resin layer, and after the organic resin layer is removed, the inorganic insulating layer which is not covered by the low wettability layer with respect to a composition containing conductive particles, is coated with a composition containing conductive particles and baked, thereby forming a conductive layer.

According to one mode of the invention, a semiconductor element is formed over a substrate, a photosensitive resin layer is formed to cover the semiconductor element, an inorganic insulating layer having a desired shape is formed over the photosensitive resin layer, a low wettability layer with respect to a composition containing conductive particles is formed on an exposed portion of the surface of the inorganic insulating layer, a part of the photosensitive resin layer is exposed to light and developed to expose a part of a conductive layer connected to a source region or a drain region of the semiconductor element, and the organic resin layer is coated with a composition containing conductive particles and baked, thereby forming a conductive layer.

The composition containing conductive particles is preferably applied by printing such as screen printing, offset printing, relief printing, and gravure printing, or a droplet discharge method. The conductive layer is typified by a wire and an antenna.

According to one mode of the invention, a substrate having a conductive layer includes a substrate, a photocatalytic layer formed over the substrate, and a conductive layer formed over the photocatalytic layer.

The planar shape of the photocatalytic layer may differ from that of the conductive layer. In that case, the photocatalytic layer with low wettability is exposed to light using a photomask with the same shape as the conductive layer, and a low wettability region and a high wettability region are formed, thereby forming a conductive layer in the high wettability region. The photocatalytic layer and the conductive layer may be formed over a part of the substrate and have the same planar shape. Note that the conductive layer is typified by a wire and an antenna.

According to the invention, a low wettability region is formed on the periphery of a region where a conductive layer is formed. Therefore, a conductive paste does not spread in the region, and the peripheral region of the conductive layer can be prevented from having a small taper angle due to overflowing from an opening of a mask. Thus, a uniform thickness of the conductive layer can be achieved. In addition, a uniform line width and distance of the conductive paste as well as a uniform width and distance of the conductive layer can be achieved since the conductive paste spreads in the high wettability region. As a result, when the conductive layer is used for an antenna, the antenna with small variations in inductance can be obtained. Further, an antenna with a large electromotive force as well as a semiconductor device with small variations of their characteristics can be obtained.

BRIEF DESCRIPTION OF THE DRAWINGS

FIGS. 1A, 1C and 1E are cross sectional views and FIGS. 1B, 1D and 1F are perspective views showing manufacturing steps of a substrate having a conductive layer of the invention.

FIGS. 3A to 3D are cross sectional views showing manufacturing steps of a substrate having a conductive layer of the invention.

DETAILED DESCRIPTION OF THE INVENTION

Figure 2A:
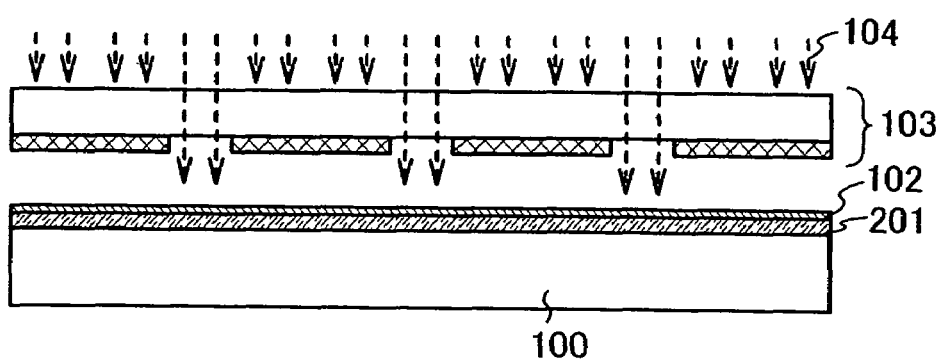
FIGS. 2A to 2C are cross sectional views showing manufacturing steps of a substrate having a conductive layer of the invention.

Although the invention will be fully described by way of Embodiment Modes and Embodiments with reference to the accompanying drawings, it is to be understood that various changes and modifications will be apparent to those skilled in the art. Therefore, unless such changes and modifications depart from the scope of the invention, they should be construed as being included therein. Note that in all the drawings to illustrate Embodiment Modes and Embodiments, the same portion or a portion having the same function is denoted by the same reference numeral, and description thereof is omitted.

Embodiment Mode 1

In this embodiment mode, steps of forming regions with different wettability over a substrate using a photomask, and steps of forming a conductive layer in the high wettability region are described with reference to FIGS. 1A to 1F. In this embodiment mode, description is made using an antenna as a typical example of a conductive layer.

FIGS. 1B, 1D and 1F are perspective views of a substrate having an antenna, and FIGS. 1A, 1C and 1E are cross sectional views along a line A-B.

An inorganic insulating layer 101 is formed over a substrate 100, and a low wettability layer 102 is formed over the inorganic insulating layer 101 (see FIGS. 1A and 1B).

The substrate 100 may be a glass substrate, a quartz substrate, a substrate made of an insulating substance such as ceramic such as alumina, a plastic substrate, a silicon wafer, a metal plate or the like.

The plastic substrate is typically made of polyethylene naphthalate (PEN), polypropylene, polypropylene sulfide, polycarbonate (PC), polyether sulfone (PES), polyphenylene sulfide, polyphenylene oxide, polyethylene terephthalate (PET), polyphtalamide, nylon, polyether ether ketone (PEEK), polysulfone (PSF), polyether imide (PEI), polyarylate (PAR), polybutylene terephthalate (PBT), or polyimide. The plastic substrate may also be made of an organic material where an inorganic particle with a diameter of a few nanometers is dispersed. The substrate 100 may have flexibility. In this embodiment mode, polycarbonate is used for the substrate 100.

As the inorganic insulating layer 101, silicon oxide ($SiO_x$), silicon nitride ($SiN_x$), silicon oxynitride ($SiO_xN_y$) (x>y), silicon nitride oxide ($SiN_xO_y$) (x>y), aluminum nitride (AlN) or the like is formed by CVD, plasma CVD, sputtering or the like. In this embodiment mode, a layer containing silicon oxide is formed by sputtering to be used as the inorganic insulating layer 101.

As the low wettability layer 102, a low wettability layer with respect to a composition that is applied later and contains conductive particles is formed. The low wettability layer 102 may be formed of a compound containing an alkyl group or a fluorocarbon chain.

As an example of a composition of the low wettability layer, an organic resin containing a fluorocarbon chain (fluorine-based resin) may be employed. The fluorine-based resin may be polytetrafluoroethylene (PTFE; 4-fluorinated ethylene resin), perfluoroalkoxy alkane (PFA; 4-fluorinated ethylene perfluoroalkylvinylether copolymer resin), perfluoroethylenepropene copolymer (PFEP; 4-fluorinated ethylene 6-fluorinated propylene copolymer resin), ethylene-tetrafluoroethylene copolymer (ETFE; 4-fluorinated ethylene-ethylene copolymer resin), polyvinylidene fluoride (PVDF; fluorinated vinylidene resin), polychlorotrifluoroethylene (PCTFE; 3-fluorinated ethylene chloride resin), ethylene-chlorotrifluoroethylene copolymer (ECTFE; 3-fluorinated ethylene chloride-ethylene copolymer resin), polytetrafluoroethylene-perfluorodioxole copolymer (TFE/PDD), polyvinyl fluoride (PVF; fluorinated vinyl resin), or the like.

As an example of a compound of the low wettability layer 102, organic silane represented by a chemical formula: $R_n\text{—Si—}X_{(4-n)}$ (n=1, 2, 3) may be employed. In this formula, R denotes a group that is comparatively inactive, such as a fluoro alkyl group and an alkyl group, and X denotes a hydrolytic group capable of coupling with a hydroxyl group, such as halogen, a methoxy group, an ethoxy group and an acetoxy group, on the surface of a substrate by condensation polymerization with the hydroxyl group or adsorption water.

As an example of organic silane, fluoroalkylsilane (hereinafter referred to as FAS) having a fluoroalkyl group as R may be employed. The fluoroalkyl group R of FAS has a structure of $(CF_3)(CF_2)_x(CH_2)_y$, where x is an integer from 0 to 10 and y is an integer from 0 to 4. When a plurality of R or X is coupled with Si, all of the R, or X may be the same or different. As a typical example of FAS, there are fluoroalkylsilane such as heptadecafluorotetrahydrodecyltriethoxysilane, heptadecafluorotetrahydrodecyltrichlorosilane, tridecafluorotetrahydrooctyltrichlorosilane, and trifluoropropyltrimethoxysilane.

As another example of organic silane, alkoxysilane having an alkyl group as R may be employed. Above all, alkoxysilane having a carbon number of 2 to 30 is preferably used. Typically, ethyltriethoxysilane, propyltriethoxysilane, octyltriethoxysilane, decyltriethoxysilane, octadecyltriethoxysilane (ODS), eicosyltriethoxysilane, and triacontyltriethoxysilane are employed. In particular, a silane compound having a long chain alkyl group is preferably used since it has very low wettability.

As a solvent of a compound for forming the low wettability layer 102, hydrocarbon-based solvent such as n-pentane, n-hexane, n-heptane, n-octane, n-decane, dicyclopentane, benzene, toluene, xylene, durene, indene, tetrahydronaphthalene, decahydronaphthalene, and squalene, or tetrahydrofuran may be used.

When the low wettability layer 102 is formed using the aforementioned materials, the materials are formed by a droplet discharge method, a method of coating a composition containing liquid or the like. Alternatively, the aforementioned materials may be formed over the surface of the inorganic insulating layer 101 by chemical adsorption. The chemical adsorption allows a monomolecular layer to be formed.

When a monomolecular layer is used for the low wettability layer 102, a part of the low wettability layer 102 can be immediately dissolved in subsequent steps. In addition, because of a uniform thickness of the monomolecular layer, the low wettability layer can be dissolved without unevenness. In order to obtain the monomolecular layer, a substrate is placed in an airtight container containing organic silane, so that organic silane is chemically adsorbed onto the surface of an insulating layer, and then the surface is washed with alcohol to be a monomolecular layer that is used for the low wettability layer. Instead, a substrate may be placed in a solution containing organic silane, so that organic silane is chemically adsorbed onto the surface of an insulating layer to be a monomolecular layer used for the low wettability layer.

In this embodiment mode, the low wettability layer 102 is formed in such a manner that the substrate is placed in an airtight container containing an FAS reagent and heated at a temperature of 110° C. for five minutes or more, so that FAS is adsorbed onto the surface of an insulating layer.

The low wettability layer 102 may also be formed by forming an insulating layer and irradiating the surface thereof with fluorine plasma. Alternatively, an electrode provided with a dielectric containing a fluorine resin is prepared and plasma is generated using air, oxygen or nitrogen to perform plasma treatment to the surface of an insulating layer, thereby forming the low wettability layer. When a fluorine-based resin is used as a dielectric, fluorine is substituted for functional groups on the surface of the insulating layer, which results in modified surface and decreased wettability.

A material in which a water-soluble resin such as polyvinyl alcohol (PVA) is mixed into a solvent such as $H_2O$ may be used as a material of the aforementioned insulating layer. Instead, PVA and another water-soluble resin may be used in combination. It is also possible to use an organic resin such as an acrylic resin, a polyimide resin, a melamine resin, a polyester resin, a polycarbonate resin, a phenol resin, an epoxy resin, polyacetal, polyether, polyurethane, polyamide (nylon), a furan resin, a diallyl phthalate resin, and a resist.

Subsequently, the low wettability layer 102 is irradiated with light 104 using a photomask 103. With the light energy, the low wettability layer 102 is partially exposed to light, the bond of the material is dissociated, and high wettability regions 112 are formed (see FIGS. 1C and 1D). At this time, each of the high wettability regions 112 has the same shape as an antenna that is formed later. Regions having low wettability remains in regions that are not irradiated with the light 104, and the remaining regions having low wettability are denoted by low wettability regions 111.

In this embodiment mode, irradiation with UV rays is performed as irradiation with the light 104 for dissociating a part of the bond of FAS. Note that the space between the low wettability layer 102 and the photomask 103 is preferably filled with oxygen. Ozone is generated by irradiating oxygen with UV rays, and the bond of FAS is dissociated more easily. At this time, the space between a lamp that is a light source and the photomask is preferably filled with nitrogen. When the space is filled with nitrogen, since UV rays are hardly absorbed by nitrogen, therefore, the photomask 103 and the low wettability layer 102 can be irradiated with UV rays keeping sufficient intensity.

The high wettability region means a region where the wettability with respect to a composition containing conductive particles is relatively high compared to that in the low wettability region. In addition, with respect to the contact angle of a composition containing conductive particles, the high wettablity region has a relatively small contact angle of a composition containing conductive particles while the low wettability region has a relatively large contact angle of a composition containing conductive particles.

The surface energy of the low wettability region is relatively low. Meanwhile, the surface energy of the high wettability region is relatively high.

When a contact angle is large, a composition does not spread and is repelled by the surface of the region, while when a contact angle is small, a composition spreads over the surface. In the invention, the difference between a contact angle ($\theta 1$) of a composition containing conductive particles in the high wettability region and a contact angle ($\theta 2$) of a composition containing conductive particles in the low wettability region is desirably 30° or more, and preferably 40° or more. That is to say, $\theta 2$ is larger than $\theta 1$ by 30° or more, and preferably 40° or more.

Next, a composition containing conductive particles (hereinafter referred to as a conductive paste) with liquid is coated or discharged onto the high wettability regions 112, then dried and baked to form conductive layers 121 (FIGS. 1E and 1F).

As the conductive paste, conductive particles having a diameter of a few nanometers to a few micrometers are dissolved or dispersed in a solvent. As the conductive particles, particles of one or more elements selected from Ag, Au, Cu, Ni, Pt, Pd, Ir, Rh, W, Al, Ta, Mo, Cd, Zn, Fe, Ti, Zr and Ba, silver halide particles, or dispersible nanoparticles of these elements may be employed. The conductive particles may contain Si or Ge. Instead, conductive layers made of these materials may be stacked to form the first conductive layers 121. The organic resin contained in the conductive paste may be one or more kinds of organic resins that serve as a binder of metal particles, a solvent, a dispersing agent, and a coating agent. Typically, an organic resin such as an epoxy resin and a silicone resin may be used.

The high wettability regions 112 are coated with the conductive paste by printing such as screen printing, offset printing, relief printing and gravure printing, or a droplet discharge method.

The conductive layer is formed by stacking conductive particles three-dimensionally and irregularly. That is, the conductive layer includes three-dimensional aggregate particles. Therefore, the surface thereof is slightly uneven. In addition, depending on the heating temperature and heating time of the conductive paste, the conductive particles are melted, then conductive particles having larger grain sizes are formed. The grain size of the conductive particles increases with the heating temperature and heating time of the conductive paste; therefore, the conductive layer has a rough surface. Note that a region where the conductive particles are melted has a polycrystalline structure in some cases.

Further, a binder formed of an organic resin remains in the conductive layer depending on the heating temperature, atmosphere and heating time.

In this embodiment mode, a print using the conductive paste is conducted in the high wettability region 112 by screen printing. As the conductive paste, a composition containing silver particles with a diameter of a few nanometers to a few tens of nanometers is employed.

Since the low wettability regions 111 are formed on the periphery of the regions where the conductive paste with liquid is coated or discharged, the conductive paste does not spread and the peripheral region of the conductive layer can be prevented from having a small taper angle due to overflowing from an opening of a mask. Thus, a uniform thickness of the conductive layer can be obtained. In addition, the conductive paste spreads in the low wettability regions and thus has a uniform width, leading to prevention of a short circuit between adjacent conductive layers. At this time, a uniform distance between the conductive layers can be achieved. As a result, the conductive layers functioning as antennas with large electromotive force can be obtained.

A loop magnetic field antenna, a dipole, monopole or patch electric field antenna, and the like may be used as the antenna in the invention. The magnetic field antenna can be designed by appropriately selecting the resistance, inductance, capacitance, and frequency thereof. Meanwhile, the electric field antenna can be designed by appropriately selecting the length thereof (e.g., ½λ or ¼λ, where λ denotes a wavelength of an electromagnetic wave), or appropriately selecting linear or circular polarization.

When the conductive paste is discharged by a droplet discharge method, a paste having a low viscosity is used. Accordingly, the conductive layer becomes thin, therefore, the conductive paste is preferably discharged several times and baked. In this case also, the low wettability region is formed, on the periphery of the conductive layer, and thus the conductive paste does not spread. As a result, a thick antenna with a low resistance can be obtained.

Embodiment Mode 2

In this embodiment mode, manufacturing steps of a conductive layer forming region, which are effectively performed compared to Embodiment Mode 1, are described with reference to FIGS. 2A to 2C. In this embodiment mode, a low wettability layer is effectively exposed to light using a photocatalytic layer.

Figure 2B:
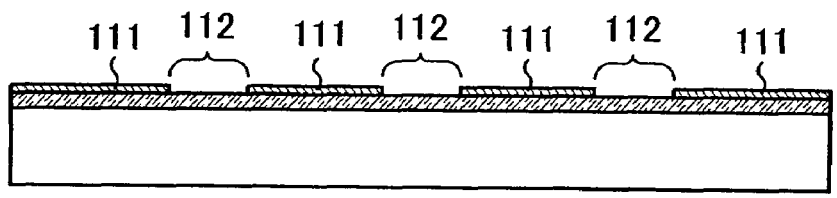
Figure 2C:
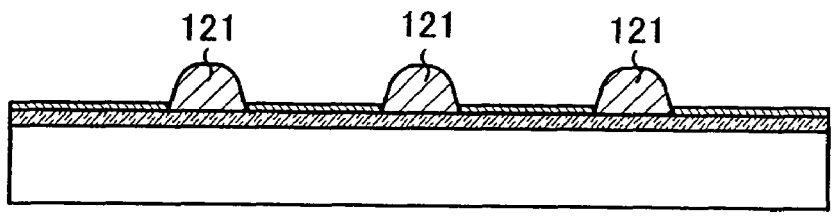

A photocatalytic layer 201 is formed over the substrate 100, and the low wettability layer 102 is formed over the photocatalytic layer 201 (see FIG. 2A).

The photocatalytic layer 201 is formed of titanium oxide ($TiO_x$), titanate ($MTiO_3$) such as strontium titanate ($SrTiO_3$), tantalate ($MTaO_3$), niobate ($M_4Nb_6O_{17}$), (note that every "M" indicates a metal element), cadmium sulfide (Cds), zinc sulfide (ZnS), cadmium selenide (CdSe), potassium tantalate ($KTaO_3$), zirconium oxide ($ZrO_2$), niobium oxide ($Nb_2O_5$), zinc oxide (ZnO), iron oxide ($Fe_2O_3$), tungsten oxide ($WO_3$), or the like.

The photocatalytic layer 201 is formed by sputtering, plasma CVD, vapor deposition, sol-gel method, reverse micelle method, electrophoresis, spin coating, a droplet discharge method, plasma spraying or the like.

In this embodiment mode, the photocatalytic layer 201 is formed by sol-gel method using titanium oxide.

Subsequently, the low wettability layer 102 is irradiated with the light 104 using the photomask 103 to expose a part of the low wettability layer 102, thereby forming the regions 112 having higher wettability compared to the low wettability layer (see FIG. 2B).

The photocatalytic layer 201 is activated when being irradiated with the light having certain energy, and the low wettability layer in contact with the photocatalytic layer 201 is decomposed. Therefore, the low wettability layer 102 can be decomposed in relatively short time and the high wettability regions 112 can be formed.

The light energy to activate the photocatalytic layer 201 depends on the material thereof. Typically, the photocatalytic layer made of titanium oxide is activated by UV light (a wavelength of 400 nm or less, and preferably 380 nm or less), while the photocatalytic layer made of cadmium sulfide is activated by visible light. In this embodiment mode, the photocatalytic layer is irradiated with UV light.

Subsequently, the high wettability regions 112 are coated with a conductive paste by printing or a droplet discharge method, then dried and baked to form the conductive layers 121. The low wettability regions 111 are formed around the high wettability regions 112, the conductive paste is repelled by the low wettability regions 111. As a result, a predetermined line width of the conductive layers as well as a uniform distance between the adjacent conductive layers can be achieved (see FIG. 2C).

Through the aforementioned steps, the substrate having the conductive layers can be obtained.

Embodiment Mode 3

In this embodiment mode, a low wettability layer is exposed to light without using a photomask.

The inorganic insulating layer 101 is formed over the substrate 100, and photocatalytic layers 301 each having a desired shape are formed over the inorganic insulating layer 101 (see FIG. 3A). Then, a low wettability layer 302 is formed over the photocatalytic layers 301 and the inorganic insulating layer 101 (see FIG. 3B). In this embodiment mode, the photocatalytic layers 301 have the same shape as conductive layers that are formed later.

The photocatalytic layers 301 are irradiated with the light 104 to be activated. As a result, the low wettability layer 302 that is in contact with the photocatalytic layers 301 is selectively reacted, and the substance of the low wettability layer is decomposed, thereby forming high wettability regions 304. In this embodiment mode, the photocatalytic layers 301 are exposed in the high wettability regions 304; however, the invention is not limited to this structure and the high wettability layers may be formed over the photocatalytic layers 301. The regions of the low wettability layer that is not in contact with the photocatalytic layers 301 is not subjected to the catalytic reaction of the photocatalytic layers, and thus remains. The remaining low wettability layers are denoted by low wettability regions 303 (see FIG. 3C).

Subsequently, the high wettability regions 304 are coated with a conductive paste, then dried and baked to form conductive layers 311 (see FIG. 3D). Note that any of the conductive pastes described in Embodiment Mode 1 may be used for the conductive paste.

Through the aforementioned steps, the substrate having the conductive layers can be obtained.

Embodiment Mode 4

In this embodiment mode, a low wettability region is selectively formed using a mask made of an organic resin.

Figure 4A:
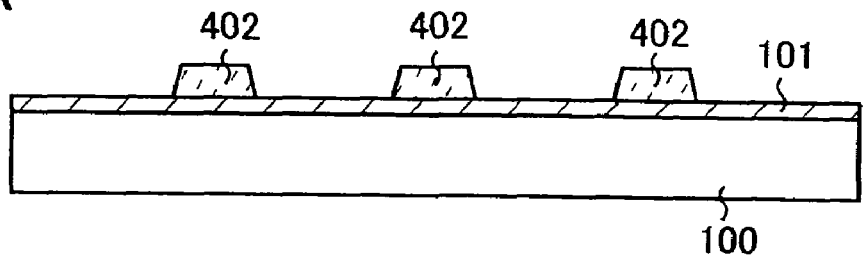
FIGS. 4A to 4D are cross sectional views showing manufacturing steps of a substrate having a conductive layer of the invention.

The inorganic insulating layer 101 is formed over the substrate 100, and organic resin layers 402 having a desired shape are formed over the inorganic insulating layer 101. In this embodiment mode, the organic resin layers 402 have the same shape as conductive layers that are formed later (see FIG. 4A).

In order to obtain the organic resin layers 402, regions where antennas are formed later are coated with a material of the organic resin layers by a droplet discharge method or printing, and then baked. Alternatively, after the entire surface is coated with a material of the organic resin layers by coating a composition containing the organic resin and liquid and then baked, the surface may be etched so that the organic resin layers 402 remain in regions where antennas are formed later.

Next, low wettability layers 403 are formed over the inorganic insulating layer 101. When the low wettability layers 403 are made of a fluorine-based resin or an alkyl resin, the low wettability layers are formed over the inorganic insulating layer 101 and the organic resin layers 402. At this time, the organic resin layers 402 may be formed of an organic resin such as polyimide, polyamide, benzocyclobutene, acrylic, an epoxy resin, polyester, a polycarbonate resin, a phenol resin, polyacetal, polyether, a furan resin, a diallyl phthalate resin, a novolac resin, a melamine resin, and a silicone resin. The organic resin layers 402 may be formed of a photosensitive organic resin. In this case, the organic resin layers may be exposed to light and developed to have a desired shape.

On the other hand, when the low, wettability layers are formed of organic silane, the low wettability layers are formed over the organic resin layers 402 as well if the surface of the organic resin layers 402 has a hydroxyl group. As the organic resin having a hydroxyl group on the surface, a phenol resin, an epoxy resin, a novolac resin and the like can be given.

Even when the organic rtesihidoes not have a hydroxyl group on the surface, a hydroxyl group can be formed on the surface by performing plasma treatment in the atmosphere to the surface of the organic resin layer. Thus, when plasma treatment is performed in the atmosphere, the low wettability layer can be formed over an organic resin having no hydroxyl group, such as polyimide, polyamide, benzocyclobutene, acrylic, polyester, a polycarbonate resin, polyacetal, polyether, a furan resin, a diallyl phthalate resin, a melamine resin, and a silicone resin.

When the organic resin layers 402 are formed of an organic resin having no hydroxyl group on the surface, the low wettability layer is not formed over the organic resin layers 402 and is formed only over the inorganic insulating layer 101. In that case, the low wettability layer can be, formed selectively.

Figure 4B:
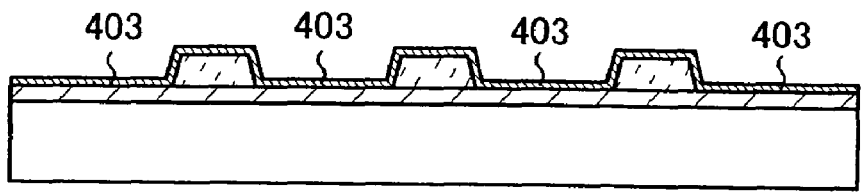

In this embodiment mode, the inorganic insulating layer 101 is formed of a silicon oxide film, the organic resin layers 402 are formed of an epoxy resin, and the low wettability layers 403 are formed of FAS. Accordingly, the low wettability layers 403 are formed over the inorganic insulating layer 101 and the surface of the organic resin layers 402 (see FIG. 4B).

Figure 4C:
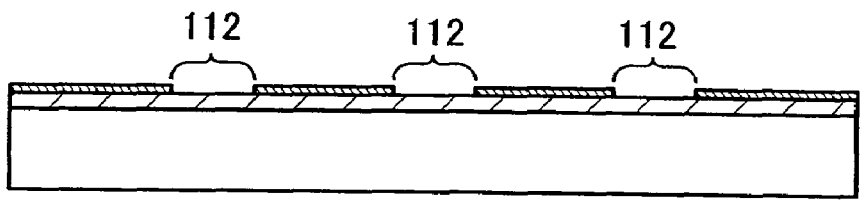

Subsequently, the organic resin layers 402 are removed to form the high, wettability regions 112. The organic resin layers 402 are removed by wet etching using a separating agent or the like. At this time, a separating agent is selected so that the low wettability layers 403 in regions other than those over the organic resin layers 402 are not removed and the organic resin layers 402 over the organic resin layers 402 are selectively removed (see FIG. 4C).

Figure 4D:
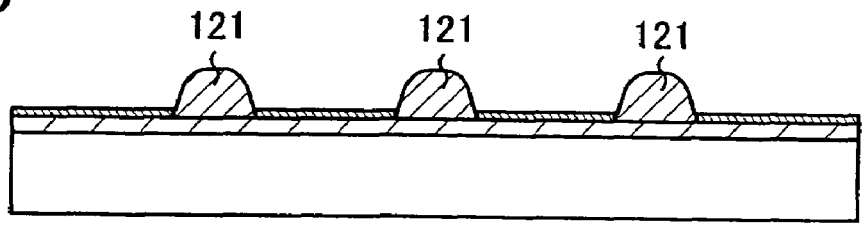

A conductive paste containing liquid is applied or discharged onto the high wettability regions 112, then dried and baked to form the conductive layers 121 (see FIG. 4D).

Through the aforementioned steps, the substrate having the conductive layers can be obtained.

Embodiment Mode 5

In this embodiment mode, a low wettability region is selectively formed over an inorganic insulating layer.

Figure 5A:
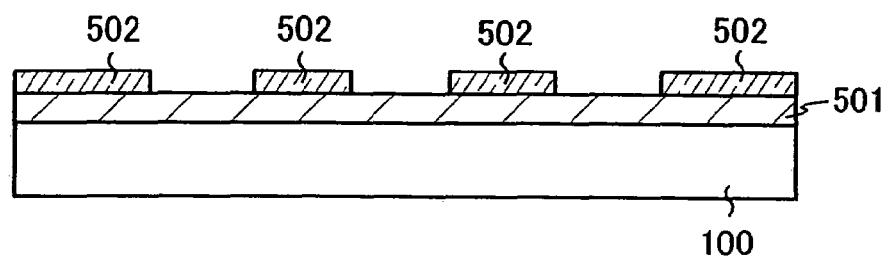
FIGS. 5A to 5C are cross sectional views showing manufacturing steps of a substrate having a conductive layer of the invention.

An organic resin layer 501 is formed over the substrate 100, and inorganic insulating layers 502 having a desired shape are formed over the organic resin layer 501. In this embodiment mode, the inorganic insulating layers 502 are formed in regions where conductive layers are not formed later (see FIG. 5A).

Since low wettability layers are selectively formed over the inorganic insulating layers 502 in subsequent steps, the organic resin layer 501 may be formed of an organic resin having no hydroxyl group, typically such as polyimide, polyamide, benzocyclobutene, acrylic, polyester, a polycarbonate resin, polyacetal, polyether, a furan resin, a diallyl phthalate resin, a melamine resin, and a silicone resin. In order to obtain the organic resin layer 501, the substrate may be coated with a material of the organic resin layer by a droplet discharge method, printing, coating or the like, and then baked. In this embodiment mode, the organic resin layer 501 is formed of polyimide.

As the inorganic insulating layers 502, silicon oxide ($SiO_x$), silicon nitride ($SiN_x$), silicon oxynitride ($SiO_xN_y$) (x>y), silicon nitride oxide ($SiN_xO_y$) (x>y), aluminum nitride (AlN) or the like is formed by CVD, plasma CVD, sputtering or the like, and then etched. Instead, the inorganic insulating layers 502 may be formed by discharging or coating a composition containing siloxane polymer with liquid by a droplet discharge method or printing, and then baking.

Figure 5B:
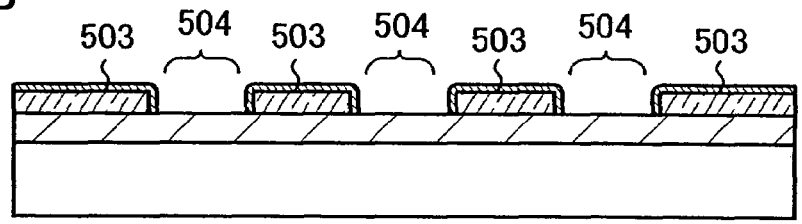
Figure 5C:
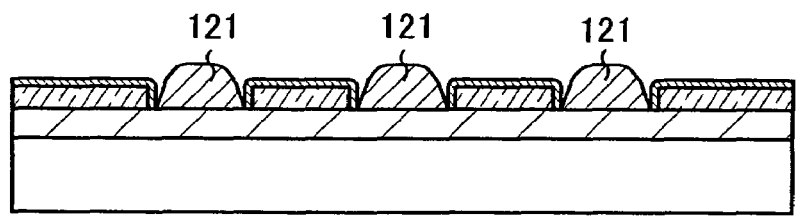
Figure 6A:
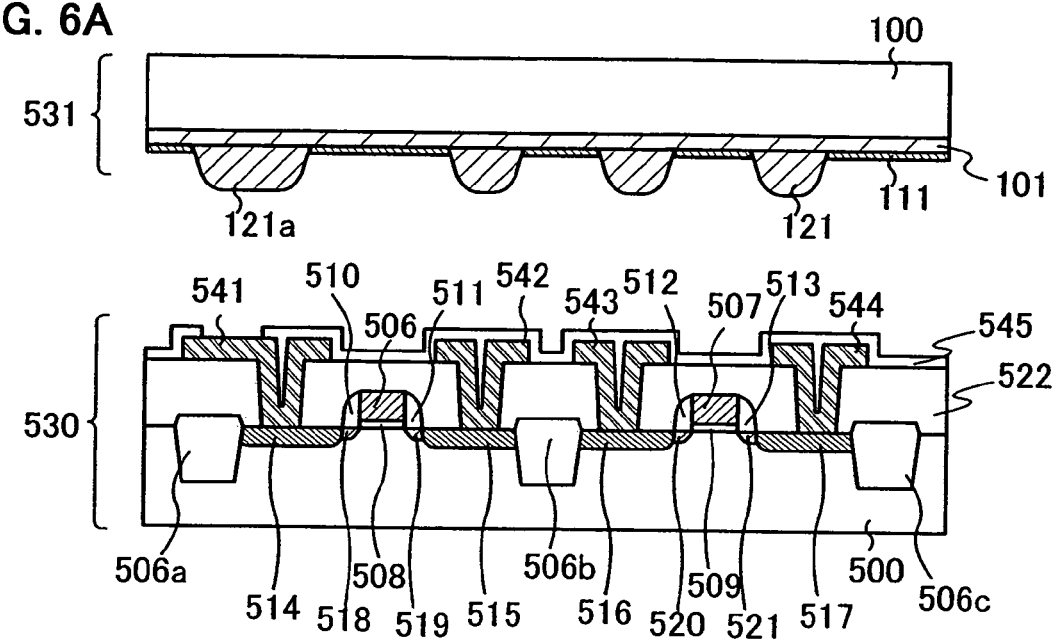
FIGS. 6A and 6B are cross sectional views showing manufacturing steps of a semiconductor device of the invention.
Figure 6B:
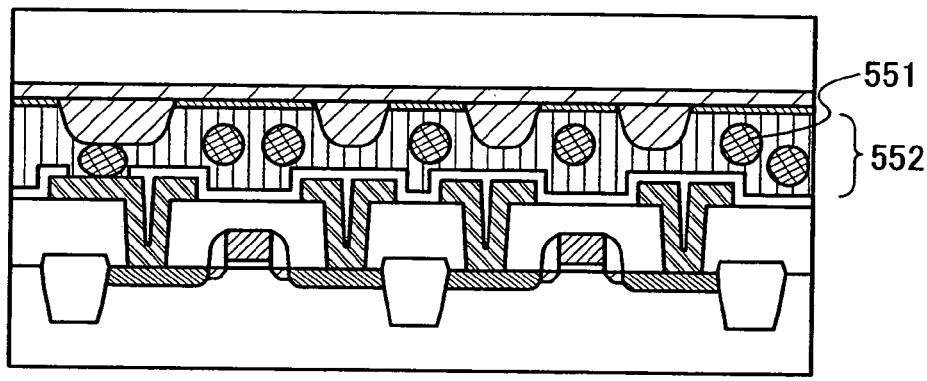

Next, low wettability layers 503 are formed over the inorganic insulating layers 502 (see FIG. 5B). The low wettability layers 503 are preferably formed of organic silane. According to this, a hydrolytic group of organic silane reacts with a hydroxyl group or with adsorption water on the surface of the inorganic insulating layers, and the low wettability layers 503 can be selectively formed over the surface of the inorganic insulating layers 502. Exposed regions of the organic resin layer 501, which are not covered with the inorganic insulating layers 502, are high wettability regions 504.

A conductive paste is applied or discharged onto the high wettability regions 504, then dried and baked to form the conductive layers 121.

Through the aforementioned steps, the substrate having the conductive layers can be obtained.

Embodiment Mode 6

In this embodiment mode, manufacturing steps of a semiconductor device having an antenna are described with reference to FIGS. 7A to 7C. Manufacturing steps of the antenna are described herein with reference to Embodiment Mode 1. A layer including a plurality of transistors is formed over a substrate 700. As these TFTs, P-channel TFTs and N-channel TFTs may be combined arbitrarily. In this embodiment mode, N-channel TFTs are employed.

TFTs 701 and 702 are formed over an insulating layer 703 that is formed over the substrate 700. The TFTs 701 and 702 are respectively constituted by semiconductor layers, gate insulating films 716a and 716b, gate electrodes 717a and, 717b, and side walls 718a and 718b provided on the side surfaces of the gate electrodes. The semiconductor layers are respectively constituted by source and drain regions 719a and 719b, low concentration impurity regions 720a and 720b, and channel forming regions 721a and 721b. The low concentration impurity regions 720a and 720b are respectively covered with the side walls 718a and 718b. Further, an insulating layer 722 is formed to cover the TFTs 701 and 702. The insulating layer 722 functions as a passivation film and has the effect of preventing impurities, typically such as alkali metal, from entering externally. Therefore, the TFTs 701 and 702 are not contaminated and can have high reliability. Note that as the passivation film, a silicon nitride film, a silicon nitride oxide film, a silicon oxynitride film or the like may be used.

Any of amorphous semiconductor, microcrystalline semiconductor, polycrystalline semiconductor, and organic semiconductor may be adopted as active layers of the semiconductor layers of the TFTs 701 and 702. In order to obtain the transistors with improved properties, a semiconductor layer is preferably crystallized using a metal element as a catalyst, or by laser irradiation. Instead, a semiconductor layer may be formed by plasma CVD using $SiH_4$ gas and $F_2$ gas, or $SiH_4$ gas and $H_2$ gas (Ar gas), or the thus obtained semiconductor layer may be irradiated with laser light.

The TFTs 701 and 702 may also adopt a crystalline semiconductor layer (low temperature polysilicon layer) that is crystallized at a temperature of 200 to 600° C. (preferably, 350 to 550° C.), or a crystalline semiconductor layer (high temperature polysilicon layer) that is crystallized at a temperature of 600° C. or more. When a high temperature polysilicon layer is formed over the substrate, a quartz substrate is preferably used since a glass substrate is not resistant to heat in some cases. Hydrogen or halogen elements are preferably added to the semiconductor layers (particularly, channel forming regions) of the TFTs 701 and 702 at a concentration of $1\times10^{19}$ to $1\times10^{22}$ atoms/cm$^3$, and preferably $1\times10^{19}$ to $5\times10^{20}$ atoms/cm$^3$.

Each of the semiconductor layers of the TFTs 701 and 702 may have a thickness of 20 to 200 nm, preferably 40 to 170 nm, further preferably 45 to 55 nm or 145 to 155 nm, and still further preferably 50 nm or 150 nm. According to this, cracks do not occur easily in the TFTs 701 and 702 even when folded.

Crystals constituting the semiconductor layers of the TFTs 701 and 702 are preferably formed so that the crystal grain boundary thereof extends parallel to the flowing direction of carriers (the channel length direction). Each of the TFTs 701 and 702 preferably has an S value (subthreshold value) of 0.35 V/dec or less (more preferably, 0.09 to 0.25 V/dec) and a mobility of 10 cm$^2$/Vs or more. Further, each of the TFTs 701 and 702 has a frequency of 1 MHz or more, and preferably 10 MHz or more at the ring oscillator level (at a voltage of 3 to 5 V). Alternatively, the frequency thereof per gate is 100 kHz or more, and preferably 1 MHz or more (at a voltage of 3 to 5 V). Such semiconductor layers can be formed by irradiation with a continuous wave laser (abbreviated as CW laser) or a pulsed laser operating at a frequency of 10 MHz or more, and preferably 60 to 100 MHz.

An element that imparts N-type or P-type conductivity is added to the low concentration impurity regions and the source and drain regions. In this embodiment mode, an N-type impurity element is added to the source and drain regions 719a and 719b and the low concentration impurity regions 720a and 720b by ion implantation or ion doping.

Although this embodiment mode shows a structure where the TFTs 701 and 702 respectively have the low concentration impurity regions 720a and 720b and the side walls 718a and 718b, the invention is not limited to this structure. The low concentration impurity regions and the side, walls are not necessarily provided.

The semiconductor layers may also be formed using an organic semiconductor material. It is desirable to use a π-electron conjugated polymer material that has skeleton including a conjugated double bond. Typically, soluble polymer materials may be used, such as polythiophene, poly(3-alkylthiophene), polythiophene derivatives, and pentacene.

Alternatively, the semiconductor layers may be formed by forming a soluble precursor and then performing a process. The organic semiconductor material obtained through a precursor includes polythienylenevinylene, poly(2,5-thienylenevinylene), polyacetylene, polyacetylene derivatives, polyallylenevinylene, and the like.

The precursor is converted into the organic semiconductor not only by performing heat treatment but also by adding a reaction catalyst such as a hydrogen chloride gas. Moreover, these soluble organic semiconductor materials are dissolved in a solvent, typically such as toluene, xylene, chlorobenzene, dichlorobenzene, anisole, chloroform, dichloromethane, γ-butyrlactone, butylcellosolve, cyclohexane, NMP (N-methyl-2-pyrrolidone), cyclohexanone, 2-butanone, dioxane, dimethylformamide (DMF), and tetrahydrofuran (THF).

An insulating layer 723 is formed to cover the TFTs 701 and 702 and the insulating layer 722 functioning as a passivation film. The insulating layer 723 is provided for planarization of the surface. Conductive layers 724a and 724b functioning as source and drain wires are connected to the source and drain regions 719a and 719b, respectively, and fill in openings provided in the insulating layers 722 and 723.

Insulating layers 726 and 727 are formed to cover the conductive layers 724a and 724b. These insulating layers 726 and 727 are provided for planarization of the surface and protection of the TFTs 701 and 702 and the conductive layers 724a and 724b.

An opening is formed in a part of the insulating layers 726 and 727 to expose the conductive layer 724a. A low wettability layer 728 is formed over the insulating layers 726 and 727, the opening thereof, and the exposed portion of the conductive layer 724a. The low wettability layer 728 may be formed using any of the materials of the low wettability layer 102 shown in Embodiment Mode 1.

Subsequently, the low wettability layer 728 is irradiated with the light 104 using the photomask 103. With the light, the low wettability layer 728 is partially exposed to light, the bonds of the material is dissociated, and high wettability regions 732 are formed. The low wettability layer remains in regions that are not irradiated with the light 104. The remaining low wettability layers are denoted as low wettability regions 731 (see FIG. 7B).

A conductive paste is applied or discharged onto the high wettability regions 732, then dried and baked to form conductive layers 741. The conductive paste may be formed using the composition and the forming method of the conductive paste described in Embodiment Mode 1. Through the aforementioned steps, the conductive layers 741 functioning as antennas connected to the TFTs can be obtained (see FIG. 7C). Further, a semiconductor device having the antennas can be obtained.

Embodiment Mode 7

In this embodiment mode, another example of manufacturing steps of a semiconductor device having an antenna is described with reference to FIGS. 8A to 8D. Manufacturing steps of an antenna are described herein with reference to Embodiment Mode 4.

Similarly to Embodiment Mode 6, the TFTs 701 and 702 are formed over the substrate 700. The insulating layer 726 and an insulating layer 801 are formed over the conductive layers 724a and 724b of the TFTs. An opening is formed in a part of the insulating layers 726 and 801 to expose the conductive layer 724a.

Figure 8A:
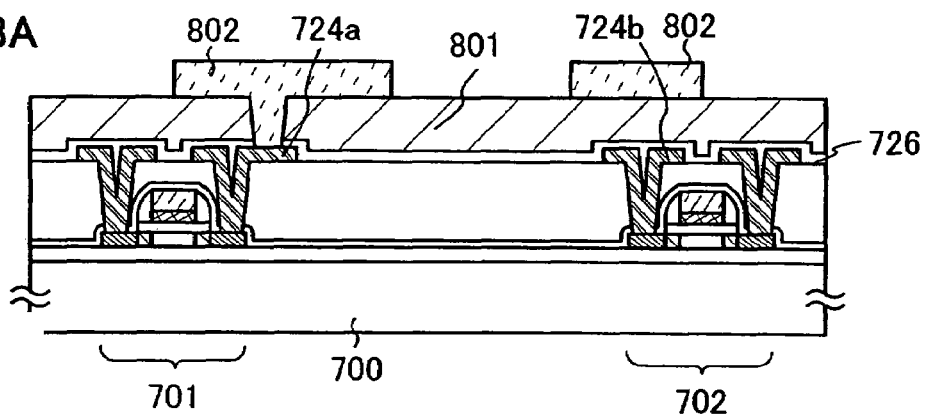
FIGS. 8A to 8D are cross sectional views showing manufacturing steps of a semiconductor device of the invention.
Figure 8B:
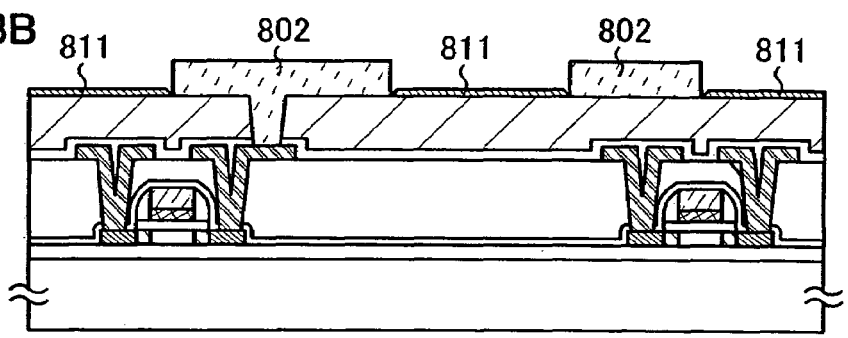

Then, organic resin layers 802 are formed in regions where antennas are formed later (see FIG. 8A). The organic resin layers 802 may be formed using the material and the forming method of the organic resin layers 402 shown in Embodiment Mode 4.

Low wettability layers 811 are formed. The low wettability layers 811 may be formed using the same material as the low wettability layer 102 shown in Embodiment Mode 1. In this embodiment mode, the organic resin layers 802 are formed of polyimide; therefore, the low wettability layers 811 can be selectively formed on exposed regions of the inorganic insulating layer (see FIG. 8B).

Figure 8C:
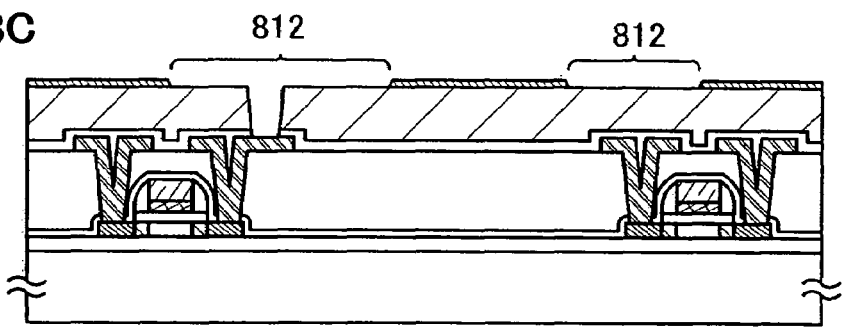
Figure 8D:
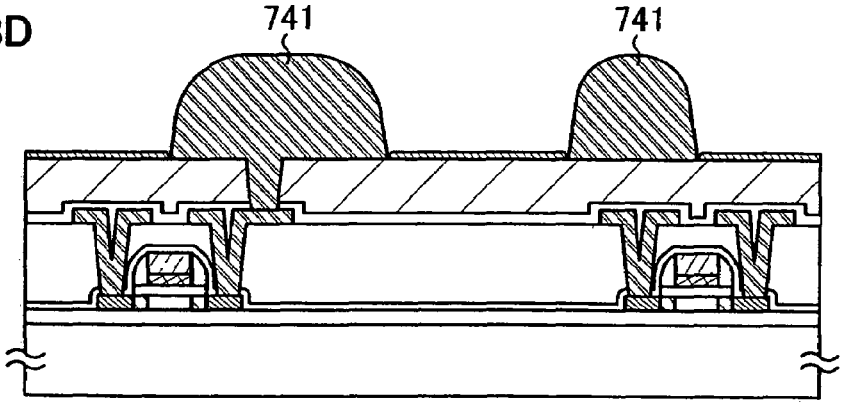
Figure 9A:
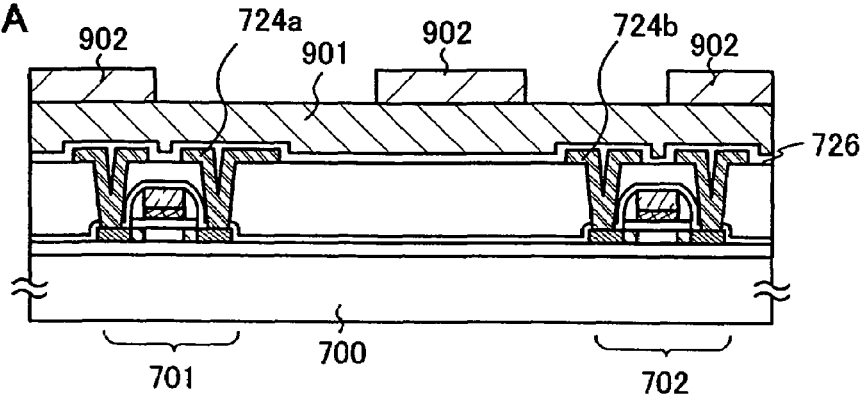
FIGS. 9A to 9D are cross sectional views showing manufacturing steps of a semiconductor device of the invention.
Figure 9B:
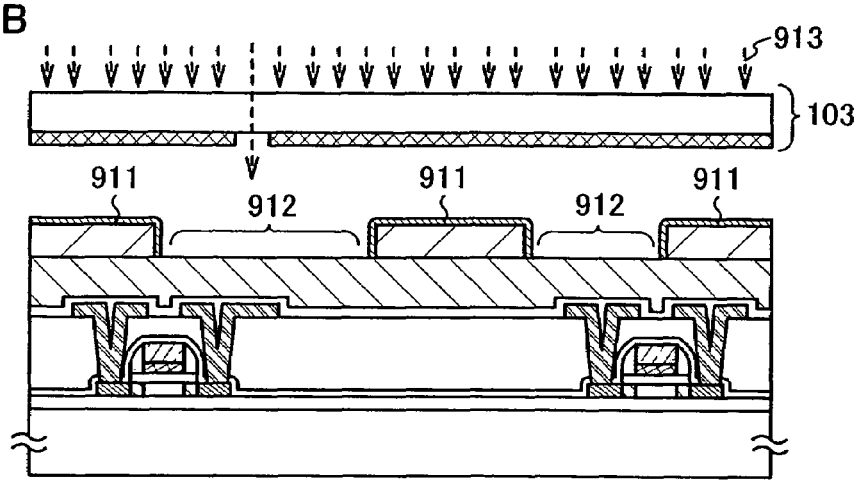
Figure 9C:
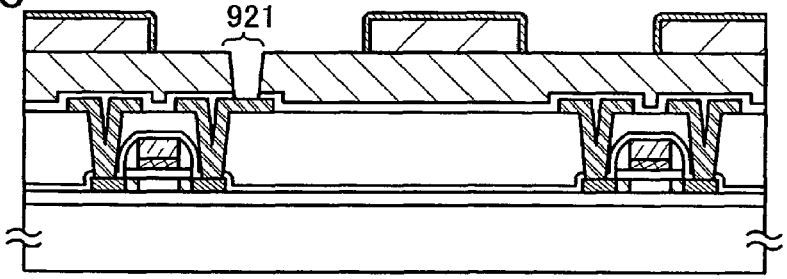
Figure 9D:
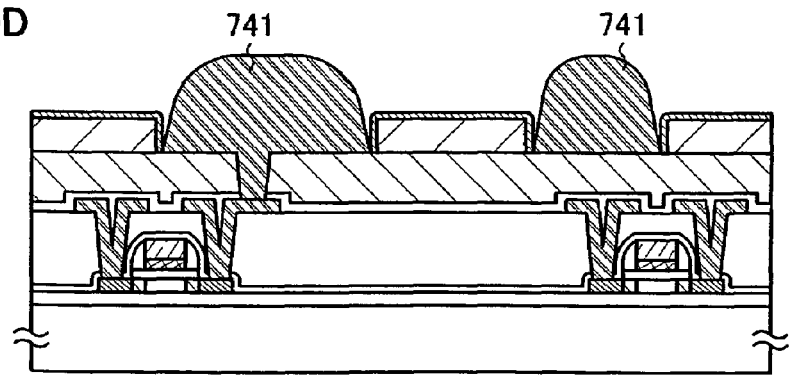

The organic resin layers 802 are removed to form high wettability regions 812 (see FIG. 8C).

A conductive paste is applied or discharged onto the high wettability regions 812, then dried and baked to form the conductive layers 741. Through the aforementioned steps, the conductive layers 741 functioning as antennas connected to the TFTs can be obtained (see FIG. 8D). Further, a semiconductor device having the antennas can be obtained.

Embodiment Mode 8

In this embodiment mode, another example of manufacturing steps of a semiconductor device having an antenna is described with reference to FIGS. 9A to 9D. Manufacturing steps of an antenna are described herein with reference to Embodiment Mode 5.

Similarly to Embodiment Mode 6, the TFTs 701 and 702 are formed over the substrate 700. The insulating layer 726 and an organic resin layer 901 are formed over the conductive layers 724a and 724b of the TFTs. Inorganic insulating layers 902 are formed over the organic resin layer 901. The inorganic insulating layers 902 are formed in regions where antennas are not formed later (see FIG. 9A).

The organic resin layer 901 is made of a positive or negative photosensitive resin. In this embodiment mode, a positive photosensitive resin is used.

The inorganic insulating layers 902 may be formed using the same material and the forming method as the inorganic insulating layers 502 shown in Embodiment Mode 5.

Then, low wettability layers 911 are formed over the inorganic insulating layers 902. The low wettability layers 911 may be formed using the same material as the low wettability layer 102 shown in Embodiment Mode 1. The material of the low wettability layers 911 is arbitrarily selected so that the organic resin layer is not coated with the material. According to this, the low wettability layers 911 can be selectively formed only over the surface of the inorganic insulating layers. Exposed portions of the organic resin layer become high wettability regions 912 (see FIG. 9B).

A part of the organic resin layer 901 is irradiated with light 913 using the photomask 103 so that a part of the organic resin layer 901 is exposed to light. Subsequently, the exposed organic resin layer is developed, and an opening 921 is formed in a part of the organic resin layer to expose the conductive layer 724a (see FIG. 9C). Note that the low wettability layers remain since the wavelength of light to expose the organic resin layer 901 is different from that of light to dissolve a part of the low wettability layers.

A conductive paste is applied or discharged onto the high wettability regions 912, then dried and baked to form the conductive layers 741. Through the aforementioned steps, the conductive layers 741 functioning as antennas connected to the TFTs can be obtained (see FIG. 9D). Further, a semiconductor device having the antennas can be obtained.

Embodiment Mode 9

Described in this embodiment mode is a semiconductor device typified by a wireless chip, which is formed using the substrate having conductive layers shown in Embodiment Modes 1 to 5. Explanation is made with reference to FIGS. 6A and 6B and FIGS. 7A to 7C. In this embodiment mode, the conductive layers function as antennas.

A semiconductor device of the invention includes a plurality of circuits that are integrated, as well as a layer 530 having a plurality of field effect transistors. Antennas are formed over a substrate through any of the steps described in Embodiment Modes 1 to 5. This embodiment mode shows a substrate 531 having antennas formed in accordance with Embodiment Mode 1 (see FIG. 6A). The layer 530 having a plurality of field effect transistors includes various TFTs.

First, a cross sectional structure of the layer 530 having a plurality of field effect transistors is described. Gate insulating layers 508 and 509 are formed over a single crystalline semiconductor substrate 500. Gate electrodes 506 and 507 are respectively formed over the gate insulating layers 508 and 509, and side walls 510 to 513 are formed on the side walls of the gate electrodes 506 and 507 and the gate insulating layers 508 and 509.

In this embodiment mode, a P-type silicon substrate is used as the single crystalline semiconductor substrate 500. The gate insulating layers 508 and 509 are formed by thermal oxidization of the P-type silicon substrate. The gate electrodes are formed of a polycrystalline silicon layer obtained by CVD. The side walls 510 to 513 are formed in such a manner that an insulating layer is formed over the entire surface and then anisotropically etched so that the insulating layer remains on the side surfaces of the gate electrodes 506 and 507.

An impurity element that imparts N-type conductivity is added to source and drain regions 514 to 517. An impurity element that imparts N-type conductivity is added to low concentration impurity regions 518 to 521. The source and drain regions 514 to 517 and the low concentration impurity regions 518 to 521 may be formed in a self-aligned manner by ion implantation or ion doping. Each of the impurity regions is separated by element isolation regions 506a to 506c.

An insulating layer 522 is formed over the single crystalline semiconductor substrate 500. The insulating layer 522 is formed for planarization of the surface. Conductive layers 541 to 544 functioning as source and drain wires are connected to the source and drain regions 514 to 517, and fill in openings provided in the insulating layer 522. An insulating layer 545 is formed to cover the conductive layers 541 to 544. The insulating layer 545 is provided to protect the FETs. Note that an opening is formed in a part of the insulating layer 545 so as to expose the conductive layer 541.

Although this embodiment mode shows a structure where the N-channel FETs have the low concentration impurity regions 518 to 521 and the side walls 510 to 513, the invention is not limited to this structure. The low concentration impurity regions and the side walls are not necessarily provided. In addition, although the circuit is constituted by the N-channel FETs in this embodiment mode, it may be constituted by an N-channel FET and a P-channel FET.

A connecting terminal 121a of the conductive layer is formed on the substrate 531 having the conductive layers 121.

The substrate 531 having the conductive layers is attached to the layer 530 having the plurality of field effect transistors with an anisotropic conductive adhesive 552. A conductive particles 551 are dispersed in the anisotropic conductive adhesive 552, and with this conductive particles 551, the connecting terminal 121a of the conductive layer is connected to the conductive layer 541 functioning as a source or drain electrode of the N-channel FET.

A typical example of the anisotropic conductive adhesive is an adhesive resin containing the dispersed conductive particles 551 (with a grain size of a few nanometers to a few tens of micrometers, and preferably about 3 to 7 μm), such as an epoxy resin and a phenol resin. The conductive particle 551 may be made of one or more elements selected from gold, silver, copper, palladium, and platinum. Instead, a multilayer structure including a plurality of layers each formed of one of these elements may be used for the conductive particles 551. Further, a thin film made of one or more elements selected from gold, silver, copper, palladium, and platinum may be formed on the surface of resin particles.

Figure 17A:
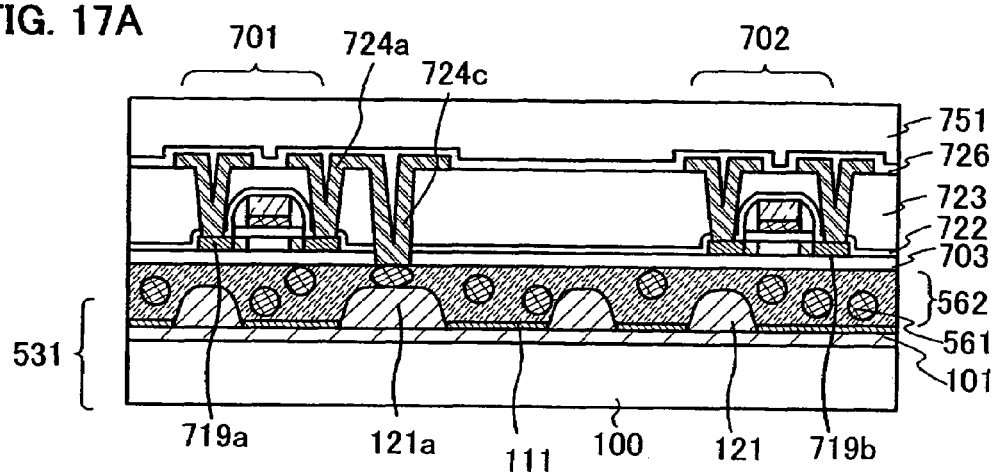
FIGS. 17A and 17B are views each showing a structure of a semiconductor device of the invention.

Another example is described next with reference to FIGS. 17A and 17B, where instead of the circuit formed using a single crystalline semiconductor substrate, a circuit is formed using TFTs over a glass substrate and antennas are connected to the back side of the TFTs. The back side of the TFTs herein means the side of the insulating layer 703 from the TFTs. More specifically, the TFTs and the antenna are electrically connected using a wire at the surface on the opposite side from the TFTs.

Figure 7A:
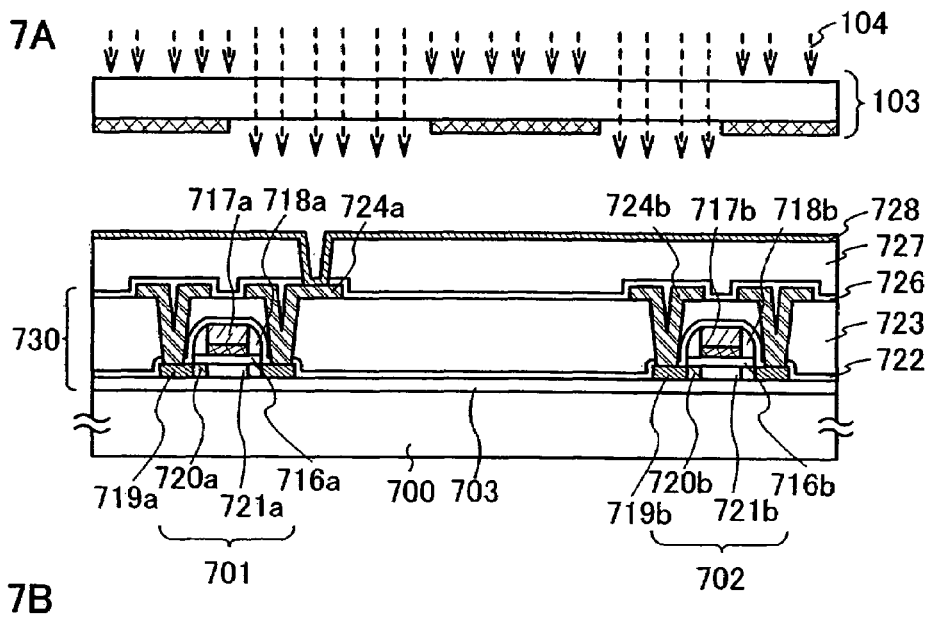
FIGS. 7A to 7C are cross sectional views showing manufacturing steps of a semiconductor device of the invention.
Figure 7B:
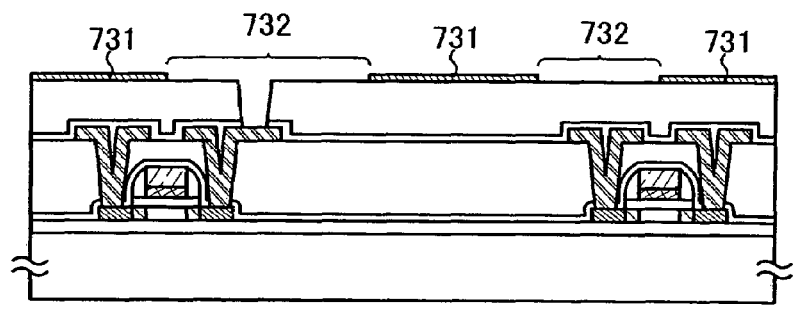
Figure 7C:
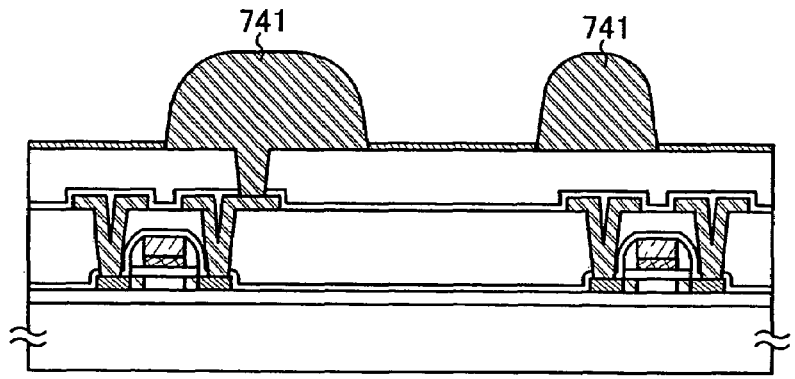

A base 751 is formed over a layer 730 including the TFTs 701 and 702, the insulating layers 722 and 723, and the conductive layers 724a and 724b, which is formed over the substrate 700 as shown in FIG. 7A, and the layer 730 including the TFTs 701 and 702, the insulating layers 722 and 723, and the conductive layers 724a and 724b is separated from the substrate 700. Then, the separated surface can be attached to the substrate 531 having the conductive layers 121 shown in Embodiment Modes 1 to 5 with an anisotropic conductive adhesive 562 (see FIG. 17A).

In this embodiment mode, the conductive layer 724a functioning as a source or drain wire of the TFT 701 has a region 724c that fills in an opening formed in the insulating layers 723, 722 and 703. Accordingly, the conductive layer is exposed on the surface of the insulating layer 703 on the back side of the TFTs, and the conductive layer functioning as an antenna can thus be connected to the back side of the TFT 701. The opening in the insulating layers 723, 722 and 703 can be formed by etching the insulating layers 723 and 722 to expose the source and drain regions 719a and 719b and the insulating layer 703, and etching the exposed portion of the insulating layer 703.

As the base 751, the substrate 100 shown in Embodiment Mode 1 or a film may be used. The film may be a film made of polypropylene, polyester, vinyl, polyvinyl fluoride, polyvinyl chloride or the like, paper of a fibrous material, or a stacked film of a base film (polyester, polyamide, an inorganic vapor deposition film, paper, or the like) and an adhesives synthetic resin film (an acrylic-based synthetic resin, an epoxy-based synthetic resin, or the like). The film may be subjected to heat treatment and pressure treatment with the subject to be processed by thermocompression bonding. In performing heat treatment and pressure treatment, an adhesive layer provided on the uppermost surface of the film or a layer (not an adhesive layer) provided on the outermost layer is melted by heat treatment to be attached by applying pressure.

An adhesive layer may be provided on the surface of the film or not. The adhesive layer corresponds to a layer containing an adhesive such as a thermosetting resin, a UV curing resin, and an epoxy resin adhesive. Silica coat is preferably used for a sheet material, and it is possible to use, for example, a sheet material where an adhesive layer, a film such as polyester, and silica coat are stacked.

The layer including the TFTs 701 and 702 may be separated from the substrate 700 in any of the following manners: (1) A substrate with heat resistance to about 300 to 500° C. is used for the substrate 700, a metal oxide film is provided between the substrate 700 and the insulating layer 703, and the metal oxide film is weakened by crystallization, thereby separating the layer including the TFTs 701 and 702; (2) An amorphous silicon film containing hydrogen is provided between the substrate 700 and the insulating layer 703, and the amorphous silicon film is removed by laser irradiation or etching using a gas or a solution, thereby separating the layer including the TFTs 701 and 702; (3) The substrate 700 over which the layer including the TFTs 701 and 702 is formed is removed mechanically or by etching using a solution or a gas such as $ClF_3$, thereby detaching the layer including the TFTs 701 and 702; and (4) A separation layer and a metal oxide film are provided between a high heat resistant substrate and the insulating layer 703, the metal oxide film is weakened by crystallization, a part of the separation layer is removed by etching using a solution or a gas such as $ClF_3$, and then the layer including the TFTs 701 and 702 is separated physically by using the weakened metal oxide film.

The anisotropic conductive adhesive 562 is, similarly to the anisotropic conductive adhesive 552, an adhesive where conductive particles 561 are dispersed. The layer including the TFTs 701 and 702 can be attached to the substrate 531 including the conductive layers by compression bonding, and further an exposed region 724c of the source or drain electrode can be electrically connected to the connecting terminal 121a of the conductive layer with the conductive particle 561.

Figure 17B:
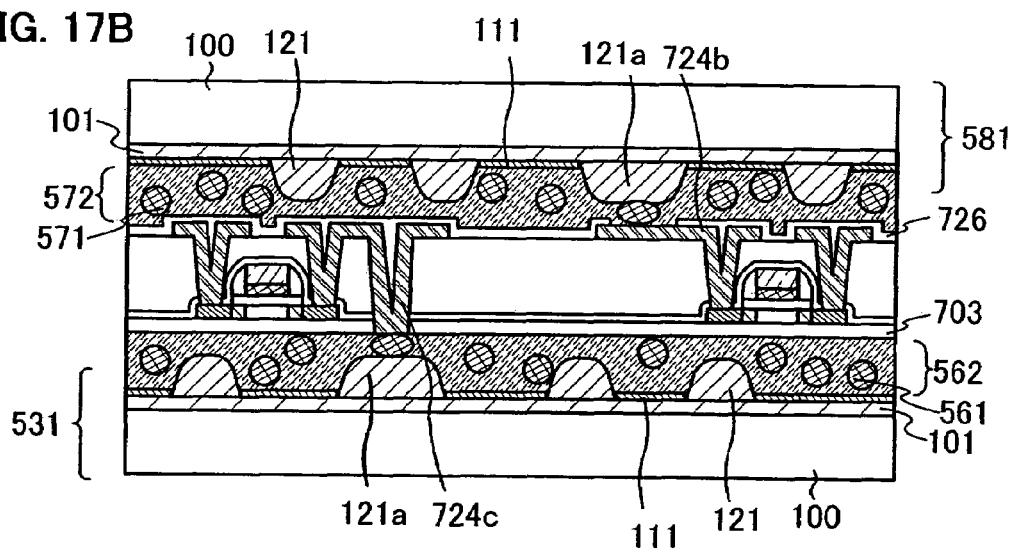

In addition, a substrate 581 having antennas on its surface may be attached to the front side of the layer including the TFTs 701 and 702 as well as the back side of it with an anisotropic conductive adhesive 572 (see FIG. 17B). Typically, a part of the source or drain electrode 724b of the TFT 702 may be exposed to be electrically connected to the connecting terminal 121a of the conductive layer formed on the substrate 581 having antennas with an anisotropic conductive particle 571.

When the separated layer including the TFTs 701 and 702 is attached to a flexible substrate or a film as described above, a semiconductor device that is thin and light, and does not break easily even when dropped can be provided. In addition, since the flexible substrate has flexibility, it can be attached to a curved surface or a surface having an irregular shape and various applications are achieved. When the substrate 700 is reused, the cost of the semiconductor devices can be held down.

If a plurality of antennas are provided, high durability can be obtained since even when one of the antennas is damaged, other antennas can receive electromagnetic waves supplied from an external system. Further, if the plurality of antennas receive electromagnetic waves of different frequency bands, electromagnetic waves of a plurality of frequency bands can be received; therefore, more various kinds of reader/writers can be adopted.

With the aforementioned structures, the semiconductor device such as a wireless chip can be obtained.

Embodiment 1

In this embodiment, manufacturing steps of a semiconductor device are described with reference to drawings. This embodiment shows manufacturing steps of the semiconductor device described in Embodiment Mode 7; however, this embodiment may be applied to any of the semiconductor devices shown in each embodiment mode.

Figure 10A:
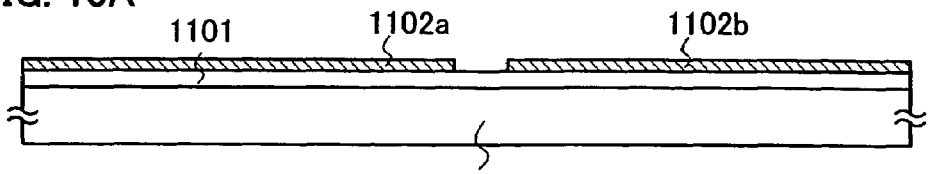
FIGS. 10A to 10E are cross sectional views showing manufacturing steps of a semiconductor device of the invention.

As shown in FIG. 10A, a first insulating layer 1101 and separation layers 1102a and 1102b are formed over a surface of a substrate 1100.

The substrate 1100 may be a glass substrate, a quartz substrate, a metal substrate or a stainless substrate having a surface over which an insulating layer is formed, and the like. Such a substrate 1100 has no limit in terms of size and shape. Accordingly, for example, if a rectangular substrate with each side of one meter or more is used for the substrate 1100, remarkably high productivity can be obtained. This is a major advantage as compared to the case of using a circular silicon substrate.

The layer having a plurality of transistors, which is provided over the substrate 1100, is to be separated from the substrate 1100 later. Accordingly, the substrate 1100 may be reused and another layer having a plurality of transistors may be formed over the substrate 1100. As a result, cost reduction can be achieved. Note that a quartz substrate is preferably used for the substrate 1100 that is reused.

After an insulating layer is formed over a surface of the substrate 1100, the insulating layer is selectively etched using a resist mask that is formed by photolithography, thereby forming the separation layers 1102a and 1102b. In order to obtain the separation layers 1102a and 1102b, a single layer or stacked layers are formed by sputtering, plasma CVD or the like using an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pd), osmium (Os), iridium (Ir), and silicon (Si), an alloy material mainly containing the elements, or a compound material mainly containing such elements. The layer containing silicon may have any of an amorphous structure, a microcrystalline structure, and a polycrystalline structure.

If each of the separation layers 1102a and 1102b has a single layer structure, it is preferable to form a tungsten layer, a molybdenum layer, or a layer containing a mixture of tungsten and molybdenum. Instead, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum corresponds, for example, to an alloy of tungsten and molybdenum.

If each of the separation layers 1102a and 1102b has a stacked layer structure, it is preferable that a tungsten layer, a molybdenum layer, or a layer containing a mixture of tungsten and molybdenum be formed as the first layer, and a layer containing an oxide, a nitride, an oxynitride, or a nitride oxide of tungsten, molybdenum, or a mixture of tungsten and molybdenum be formed as the second layer.

If each of the separation layers 1102a and 1102b has a stacked layer structure of a layer containing tungsten and a layer containing an oxide of tungsten, a layer containing silicon oxide may be formed over the layer containing tungsten, so that the layer containing an oxide of tungsten is formed on the boundary between the tungsten layer and the silicon oxide layer. Further, the surface of the tungsten layer may be subjected to thermal oxidation treatment, oxygen plasma treatment, or treatment using a strong oxidizing solution such as ozone water to form a layer containing an oxide of tungsten. The same applies to the case of forming a layer containing a nitride, an oxynitride and a nitride oxide of tungsten. After a layer containing tungsten is formed, a silicon nitride layer, a silicon oxynitride layer and a silicon nitride oxide layer may be formed thereover.

The oxide of tungsten is represented by $WO_x$, where x ranges from 2 to 3. There are cases where x is 2 ($WO_2$), 2.5 ($W_2O_5$), 2.75 ($W_4O_{11}$), 3 ($WO_3$), or the like. In forming the oxide of tungsten, the value of x is not limited particularly and it may be decided depending on the etching rate or the like. However, it is a layer containing an oxide of tungsten ($WO_x$, 0<x<3) formed by sputtering in an oxygen atmosphere that has the most desirable etching rate. Therefore, in order to reduce the manufacturing time, it is preferable to form a layer containing an oxide of tungsten by sputtering in an oxygen atmosphere as the separation layer.

In the aforementioned steps, the first insulating layer 1101 is formed between the substrate 1100 and the separation layers 1102a and 1102b; though the invention is not limited to these steps. The separation layers 1102a and 1102b may be formed in contact with the substrate 1100.

In this embodiment, a glass substrate is used for the substrate 1100, a silicon oxynitride layer with a thickness of 100 nm is formed by CVD as the first insulating layer 1101, and a tungsten layer with a thickness of 30 nm is formed by sputtering as the separation layers 1102a and 1102b.

Figure 10B:
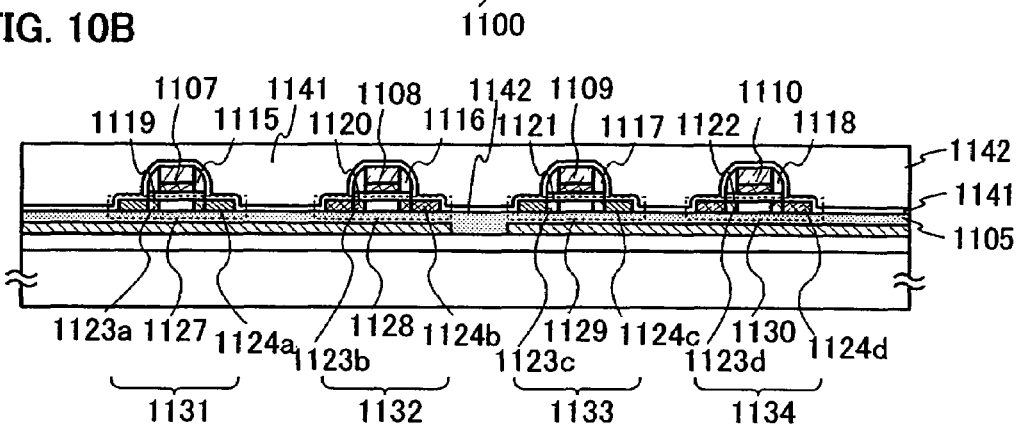

Subsequently, as shown in FIG. 10B, an insulating layer 1105 is formed as a base film to cover the separation layers 1102a and 1102b. In order to obtain the insulating layer 1105, a single layer or stacked layers are formed by sputtering, plasma CVD or the like using an oxide of silicon or a nitride of silicon. The oxide of silicon is a material containing silicon (Si) and oxygen (O), and corresponds to silicon oxide, silicon oxynitride, silicon nitride oxide and the like. The nitride of silicon is a material containing silicon and nitrogen (N), and corresponds to silicon nitride, silicon oxynitride, silicon nitride oxide and the like. The insulating layer to be a base film functions as a blocking film for preventing impurities of the substrate 1100 from entering.

In this embodiment, a silicon oxide layer with a thickness of 200 nm is formed by sputtering as the insulating layer 1105 used as a base film.

Next, an amorphous semiconductor layer (e.g., a layer containing amorphous silicon) is formed over the insulating layer 1105. Then, the amorphous semiconductor layer is crystallized by laser crystallization, thermal crystallization using RTA or an annealing furnace, thermal crystallization using a metal element that accelerates crystallization, a method combining laser crystallization and thermal crystallization using a metal element that accelerates crystallization, or the like, thereby forming a crystalline semiconductor layer. After that, the obtained crystalline semiconductor layer is etched to have a desired shape to form crystalline semiconductor layers 1127 to 1130.

Manufacturing steps of the crystalline semiconductor layers 1127 to 1130 are described specifically. First, an amorphous semiconductor layer with a thickness of 66 nm is formed by plasma CVD. After the amorphous semiconductor layer is coated with a solution containing nickel that is a metal element for accelerating crystallization, the amorphous semiconductor layer is subjected to dehydrogenation treatment (at 500° C. for one hour) and thermal crystallization treatment (at 550° C. for four hours), thereby forming a crystalline semiconductor layer. Then, the crystalline semiconductor layer may be irradiated with laser light if necessary, and selectively etched using a resist mask that is formed by photolithography, so that the crystalline semiconductor layers 1127 to 1130 are formed.

If the crystalline semiconductor layers 127 to 1130 are formed by laser crystallization, a continuous wave solid state or gas laser or a pulsed solid state or gas laser is employed.

An amorphous, semiconductor layer functioning as a gettering site may be formed over the crystalline semiconductor layers. The amorphous semiconductor layer functioning as a ettering site is required to contain an impurity element such as phosphorus and argon; therefore, it is preferably formed by sputtering so as to contain argon at a high concentration. Then, a metal element in the crystalline semiconductor layers is diffused in the amorphous semiconductor layer by heat treatment (such as RTA and thermal anneal using an annealing furnace), and the amorphous semiconductor layer containing the metal element is removed. As a result, the metal element in the crystalline semiconductor layers can be reduced or removed.

Subsequently, a second insulating layer is formed to cover the crystalline semiconductor layers 1127 to 1130. In order to obtain the second insulating layer, a single layer or stacked layers are formed by plasma CVD or sputtering using an oxide of silicon or a nitride of silicon.

In this embodiment, a silicon oxynitride layer is formed by CVD as the second insulating layer.

Next, a first conductive layer and a second conductive layer are stacked over the second insulating layer. The first conductive layer is formed by plasma CVD, sputtering or the like to have a thickness of 20 to 100 nm. The second conductive layer is formed to have a thickness of 100 to 400 nm. The first conductive layer and the second conductive layer are formed of an element selected from tantalum (Ta), tungsten (W), titanium (Ti), molybdenum (Mo), aluminum (Al), copper (Cu), chromium (Cr), and niobium (Nb), or an alloy material or a compound material mainly containing such elements. Alternatively, the first and second conductive layers may be formed of a semiconductor material doped with an impurity element such as phosphorus, typically such as polycrystalline silicon.

The first conductive layer and the second conductive layer are formed by combining, for example, tantalum nitride (TaN) and tungsten (W), tungsten nitride (WN) and tungsten, molybdenum nitride (MoN) and molybdenum, (Mo), and the like. When the first conductive layer and the second conductive layer are formed of tungsten and tantalum nitride that have high heat resistance, they may be subjected to heat treatment for thermal activation.

In this embodiment, a tantalum nitride layer with a thickness of 30 nm is formed as the first conductive layer, while a tungsten layer with a thickness of 370 nm is formed as the second conductive layer.

Subsequently, a resist mask is formed by photolithography and etching is performed to form gate electrodes, thereby forming conductive layers (also referred to as gate electrodes) 1107 to 1110 functioning as gate electrodes.

An impurity element that imparts N-type conductivity or P-type conductivity is added to the crystalline semiconductor layers 1128 to 1130 at a low concentration by ion doping or ion implantation, thereby forming N-type impurity regions and P-type impurity regions.

A third insulating layer is formed to cover the second insulating layer and the conductive layers 1107 to 1110. In order to obtain the third insulating layer, a single layer or stacked layers are formed by plasma CVD, sputtering or the like using a layer (also referred to as an inorganic layer) containing an inorganic material such as silicon, an oxide of silicon and a nitride of silicon, or a layer (also referred to as an organic layer) containing an organic material such as an organic resin.

In this embodiment, a silicon oxynitride layer is formed by CVD as the third insulating layer.

Then, the third insulating layer is selectively etched by anisotropic etching that is mainly in the direction perpendicular to the surface of the substrate, so that insulating layers (hereinafter referred to as side wall insulating layers) 1115 to 1118 are formed in contact with the side walls of the conductive layers 1107 to 1110 (see FIG. 10C). The side wall insulating layers 1115 to 1118 are used as masks for doping to form LDD regions later.

In the etching step for forming the side wall insulating layers 1115 to 1118, the second insulating layer is also etched to form gate insulating layers 1119 to 1122. The gate insulating layers 1119 to 1122 overlap the conductive layers 1107 to 1110 and the side wall insulating layers 1115 to 1118. When the etching rate of the material of the second insulating layer is equal to that of the side wall insulating layers 1115 to 1118, the second insulating layer is etched as shown in FIG. 10B. Accordingly, when the etching rate of the material of the second insulating layer is different from that of the side wall insulating layers 1115 to 1118, the second insulating layer may remain even when the etching step is performed to form the side wall insulating layers 1115 to 1118.

Subsequently, an impurity element that imparts N-type conductivity is added to the crystalline semiconductor layers 1127 and 1129 using the side wall insulating layers 1115 and 1117 as masks, thereby forming first N-type impurity regions (also called LDD regions) 1123a and 1123c and second N-type impurity regions 1124a and 1124c.

An impurity element that imparts P-type conductivity is added to the crystalline semiconductor layers 1128 and 1130, thereby forming first P-type impurity regions (also called LDD regions) 1123b and 1123d and second P-type impurity regions 1124b and 1124d.

The concentration of the impurity element contained in the first N-type impurity regions 1123a and 1123c is lower than that of the impurity element contained in the second N-type impurity regions 1124a and 1124c. Similarly, the concentration of the impurity element contained in the first P-type impurity regions 1123b and 1123d is lower than that of the impurity element contained in the second P-type impurity regions 1124b and 1124d.

The first N-type impurity regions 1123a and 1123c and the first P-type impurity regions 1123b and 1123d are formed by either of the following two methods: a gate electrode having a two or more layer structure is anisotropically etched so as to have a tapered shape and the lower conductive layer of the gate electrode is used as a mask; or a sidewall insulating layer is used as a mask. The structure of a thin film transistor that is formed by employing the former method is referred to as a GOLD (Gate Overlapped Lightly Doped drain) structure. The invention may adopt any of the two methods; however, the latter method where a side wall insulating layer is used as a mask has the advantages that the LDD region is surely formed and the width of the LDD region is controlled easily.

Through the aforementioned steps, N-type thin film transistors 1131 and 1133 and P-type thin film transistors 1132 and 1134 are completed.

Each of the N-type thin film transistors 1131 and 1133 has an LDD structure, and includes an active layer having a first N-type impurity region (also called an LDD region), a second N-type impurity region and a channel forming region, a gate insulating layer, and a conductive layer functioning as a gate electrode. Each of the P-type thin film transistors 1132 and 1134 has an LDD structures and includes an active layer having a first P-type impurity region (also called an LDD region), a second N-type impurity region and a channel forming region, a gate insulating layer, and a conducive layer functioning as a gate electrode.

Subsequently, an insulating layer is formed of a single layer or stacked layers to cover the thin film transistors 1131 to 1134.

This embodiment shows the case where two insulating layers are stacked to cover the thin film transistors 1131 to 1134, and a layer with a thickness of 50 nm is formed of silicon oxynitride as a fourth insulating layer 1141 while a layer with a thickness of 600 nm is formed of silicon oxide as fifth insulating layer 1142. Further, another insulating layer may be formed of silicon oxide over the upper insulating layer 1142.

Before forming the insulating layers 1141 and 1142, or after forming one or both of the insulating layers 1141 and 1142, heat treatment may be performed for recovery of the crystallinity of the semiconductor layers, activation of impurity elements added to the semiconductor layers, and hydrogenation of the semiconductor layers. As the heat treatment, thermal anneal, laser anneal, RTA or the like may be adopted.

Figure 10C:
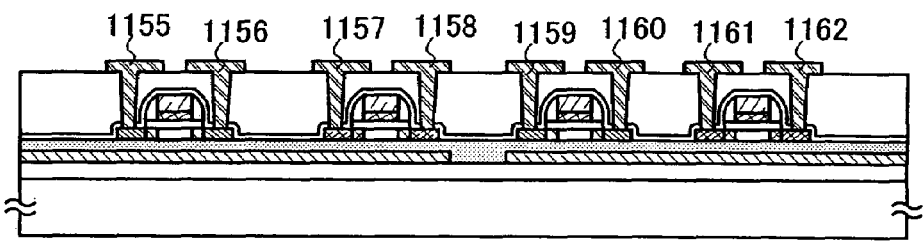

Next, as shown in FIG. 10C, the insulating layers 1141 and 1142 are selectively etched using a resist mask that is formed by photolithography, thereby forming openings to expose the second N-type impurity regions 1124a and 1124c and the second P-type impurity regions 1124b and 1124d.

Then, conductive layers are formed to fill in the openings, and selectively etched to form conductive layers 1155 to

1162. The conductive layers 1155 to 1162 function as source wires or drain wires of the TFTs.

In order to obtain the conductive layers 1155 to 1162, a single layer or stacked layers are formed by plasma CVD, sputtering or the like using an element selected from titanium (Ti), aluminum (Al) and neodymium (Nd), or an alloy material or a compound material mainly containing such elements. The alloy material mainly containing aluminum corresponds, for example, to a material that mainly contains aluminum and contains nickel, or an alloy material that mainly contains aluminum and contains nickel and one or both of carbon and silicon.

In this embodiment, as the conductive layers 1155 to 1162, a titanium layer with a thickness of 60 nm, a titanium nitride layer with a thickness of 40 nm, an aluminum layer with a thickness of 500 nm, a titanium layer with a thickness of 60 nm, and a titanium nitride layer with a thickness of 40 nm are stacked in this order from the insulating layer 1142 side by sputtering.

Figure 10D:
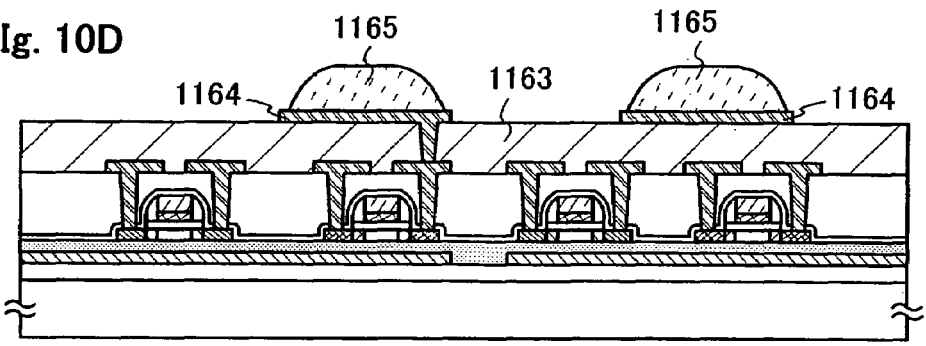

Subsequently, as shown in FIG. 10D, an insulating layer 1163 is formed of a single layer or stacked layers to cover the conductive layers 1155 to 1162. In this embodiment, the insulating layer 1163 that covers the conductive layers 1155 to 1162 is formed of an inorganic insulating layer. As the inorganic insulating layer, siloxane polymer with a thickness of 1.5 μm is applied, then dried and baked to form the insulating layer 1163.

Similarly to the insulating layer 1142 that covers the thin film transistors, openings are formed in the insulating layer 1163 that covers the conductive layers 1155 to 1162, and conductive layers 1164 are formed. The conductive layers 1164 function as a part of antennas.

In this embodiment, a titanium layer, and a titanium-aluminum alloy layer are formed in this order from the insulating layer 1142 side by sputtering, and etched to have a desired shape, thereby forming the conductive layer 1164.

Next, as shown in FIG. 10D, organic resin layers 1165 are formed over the conductive layers 1164. In this embodiment, the organic resin layers 1165 are formed by discharging polyimide onto the conductive layers 1164 by a droplet discharge method. The organic resin layers 1165 function as masks for forming low wettability layers later.

Figure 10E:
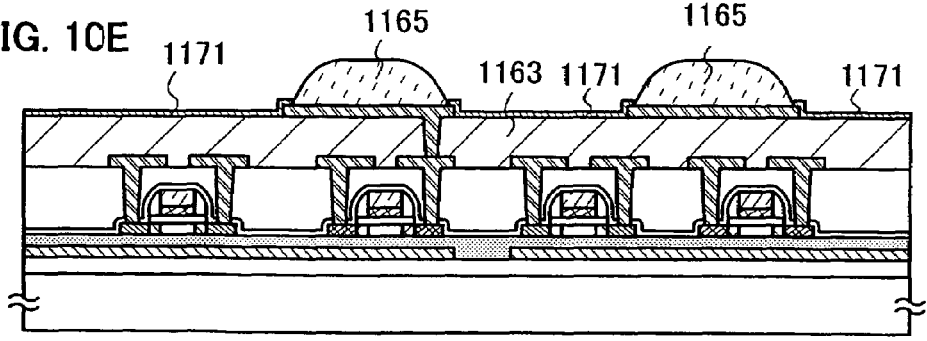

As shown in FIG. 10E, low wettability layers 1171 are formed over the exposed insulating layer 1163. In this embodiment, the low wettability layers 1171 are formed by chemically adsorbing FAS over the surface of the insulating layer 1163.

Figure 11A:
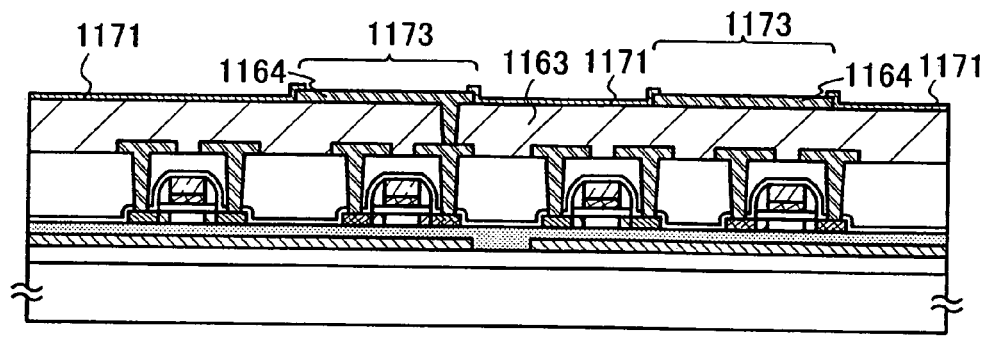
FIGS. 11A to 11C are cross sectional views showing manufacturing steps of a semiconductor device of the invention.

As shown in FIG. 11A, the organic resin layers 1165 are removed to expose the conductive layers 1164, thereby forming high wettability regions 1173.

Figure 11B:
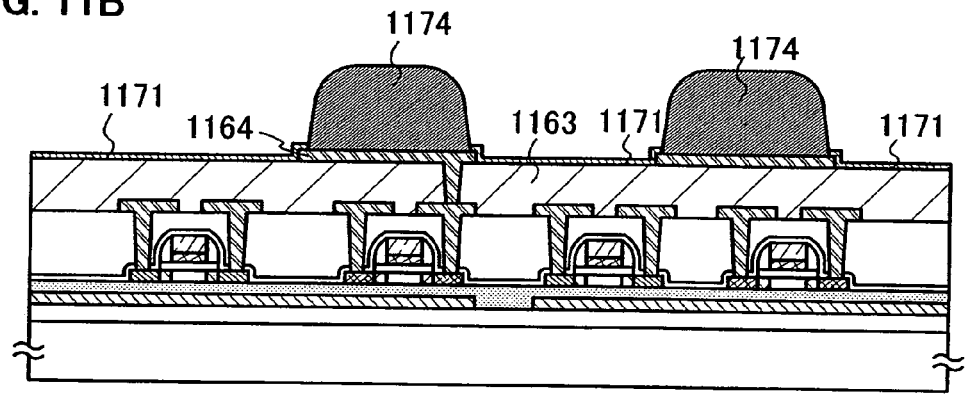

As shown in FIG. 11B, a conductive paste is applied or discharged onto the conductive layers 1164, then dried and baked to form conductive layers 1174 with a thickness of 5 to 40 μm. Through the aforementioned steps, the conductive layers 1174 functioning as antennas connected to the TFTs are obtained. After that, the low wettability layers 1171 are removed by oxygen ashing.

A protective layer containing carbon such as DLC (Diamond Like Carbon), silicon nitride, silicon nitride oxide or the like may be formed over the insulating layer 1163 and the conductive layers 1174 functioning as antennas.

Figure 11C:
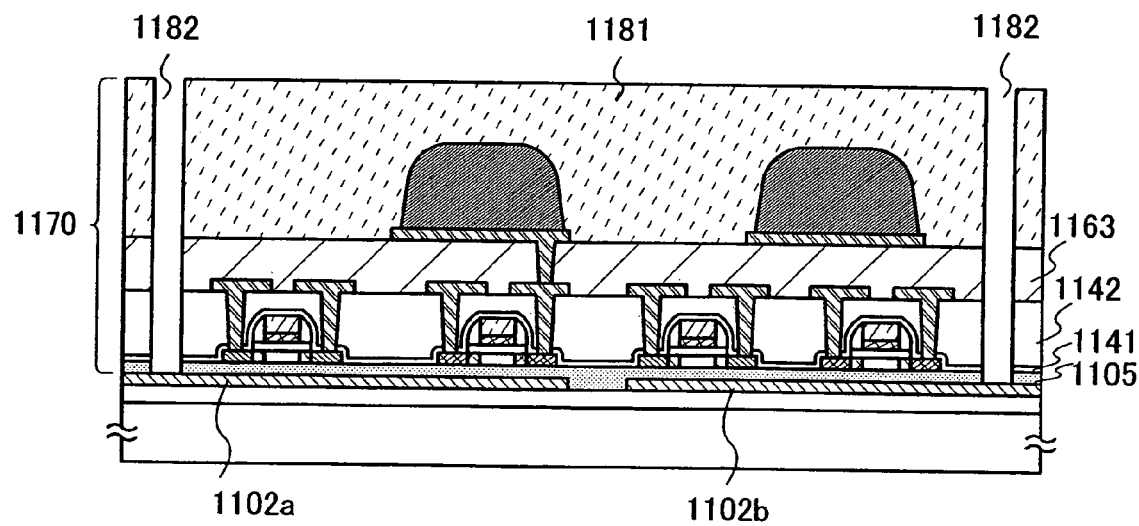

As shown in FIG. 11C, an insulating layer 1181 is formed over the insulating layer 1163. The insulating layer 1181 is preferably a planarized layer since it functions as a protective layer in subsequent separation steps.

In this embodiment, the insulating layer 1181 is formed of an epoxy resin with a thickness of 15 μm by screen printing.

Then, openings 1182 are formed to expose the separation layers 1102a and 1102b. The openings 1182 are formed by removing a part of the insulating layers 1105, 1141, 1142, 1163, and 1181 by laser ablation or photolithography.

In this embodiment, the openings 1182 are formed by irradiation of laser beams from a UV laser.

Figure 12A:
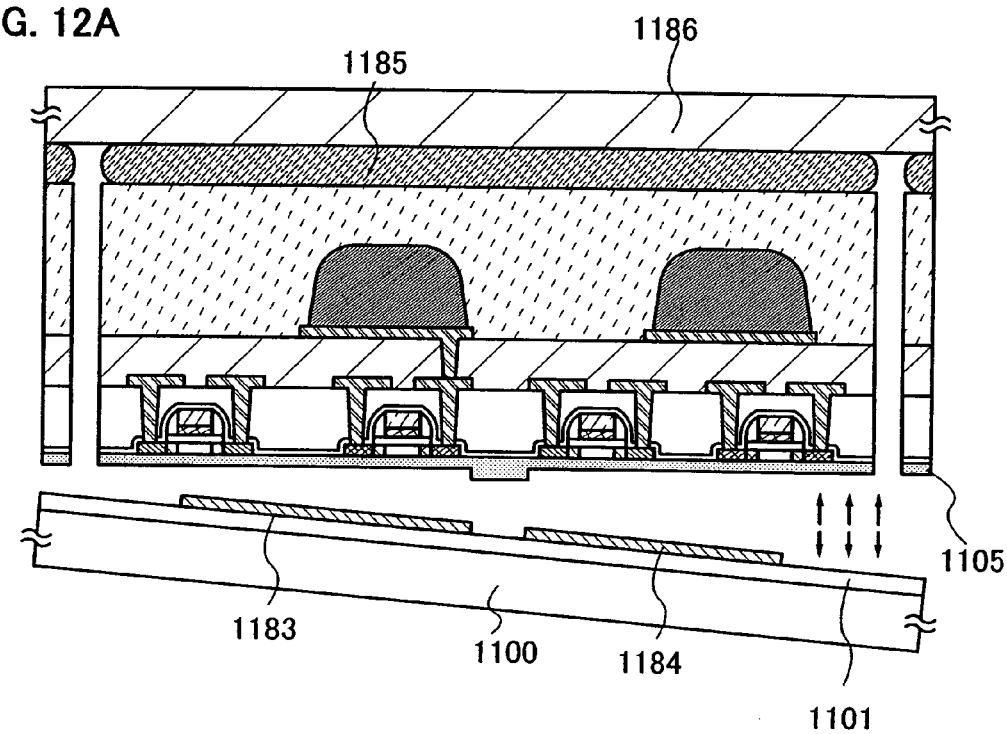
FIGS. 12A and 12B are cross sectional views showing manufacturing steps of a semiconductor device of the invention.

An etching agent is introduced into the openings 1182, thereby removing a part of the separation layers 1102a and 1102b as shown in FIG. 12A. The separation layers that are partially etched are denoted by remaining separation layers 1183 and 1184. In the case of wet etching, a mixed solution obtained by diluted hydrofluoric acid with water or ammonium fluoride, a mixed solution of hydrofluoric acid and nitric acid, a mixed solution of hydrofluoric acid, nitric acid and acetic acid, a mixed solution of hydrogen peroxide and sulfuric acid, a mixed solution of hydrogen peroxide, ammonia water and water, a mixed solution of hydrogen peroxide, hydrochloric acid and water, and the like are used as the etching agent. Meanwhile, in the case of dry etching, a gas containing halogen-based atoms or molecules such as fluorine is employed. A gas or a solution containing halogen fluoride or a halogen compound is preferably used as the etching agent.

In this embodiment, a part of the separation layers is etched using chlorine trifluoride ($ClF_3$). The separation layers that are partially etched are denoted by the remaining separation layers 1183 and 1184.

As shown in FIG. 12A, the surface of the insulating layer 1181 is attached to a base 1186 with an adhesive 1185, and the substrate 1100 and the remaining separation layers 1183 and 1184 are separated from a layer 1170 including the plurality of transistors.

In this embodiment, a transposing roller provided with a low adhesive film is used as the base 1186 and turned while applying the adhesive 1185, so that only the layer 1170 including the plurality of transistors, which is provided over the insulating layer 1105, is transposed onto the base 1186. Such a transposing roller may be formed of a silicone-based resin or a fluorine-based resin.

Here, the adhesive strength between the base 1186 and the layer 1170 including the plurality of transistors is set higher than that between the substrate 1100 and the insulating layer 1105. Then, only the layer 1170 including the plurality of transistors, which is provided over the insulating layer 1105, is separated from the substrate.

Then, the base 1186 is separated from the layer 1170 including the plurality of transistors.

Figure 12B:
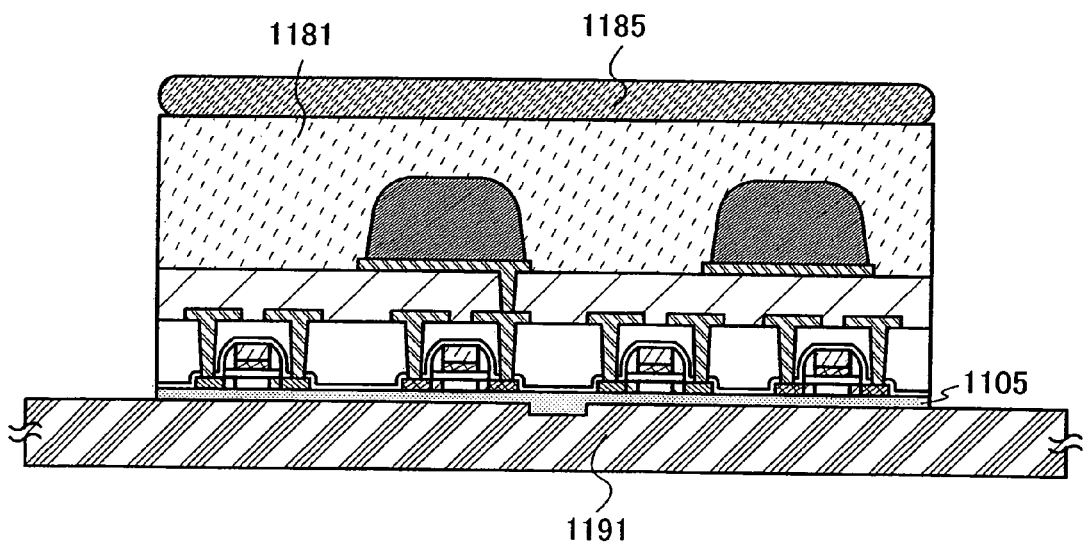

As shown in FIG. 12B, a film 1191 is attached to the insulating layer 1105. The film 1191 may be a film made of polypropylene, polyester, vinyl, polyvinyl fluoride, polyvinyl chloride or the like, paper of a fibrous material, or a stacked film of a base film (polyester, polyamide, an inorganic vapor deposition film, paper, or the like) and an adhesive synthetic resin film (an acrylic-based synthetic resin, an epoxy-based synthetic resin, or the like). The film may be obtained by performing heat treatment and pressure treatment to the subject by thermocompression bonding. In performing heat treatment and pressure treatment, an adhesive layer provided on the uppermost surface of the film or a layer (not an adhesive layer) provided on the outermost layer is melted by heat treatment to be attached by applying pressure.

An adhesive layer may be provided on the surface of the film 1191 or not. The adhesive layer corresponds to a layer containing an adhesive such as a thermosetting resin, a UV curing resin, an epoxy resin-based adhesive, and a resin additive. Silica coat is preferably used for a sheet material, and it is possible to use, for example, a sheet material where an adhesive layer, a film such as polyester, and silica coat are stacked.

If the film 1191 is formed of a sheet material where an adhesive layer, a PET film and silica coat are stacked, moisture and the like can be prevented from entering after sealing.

Figure 13A:
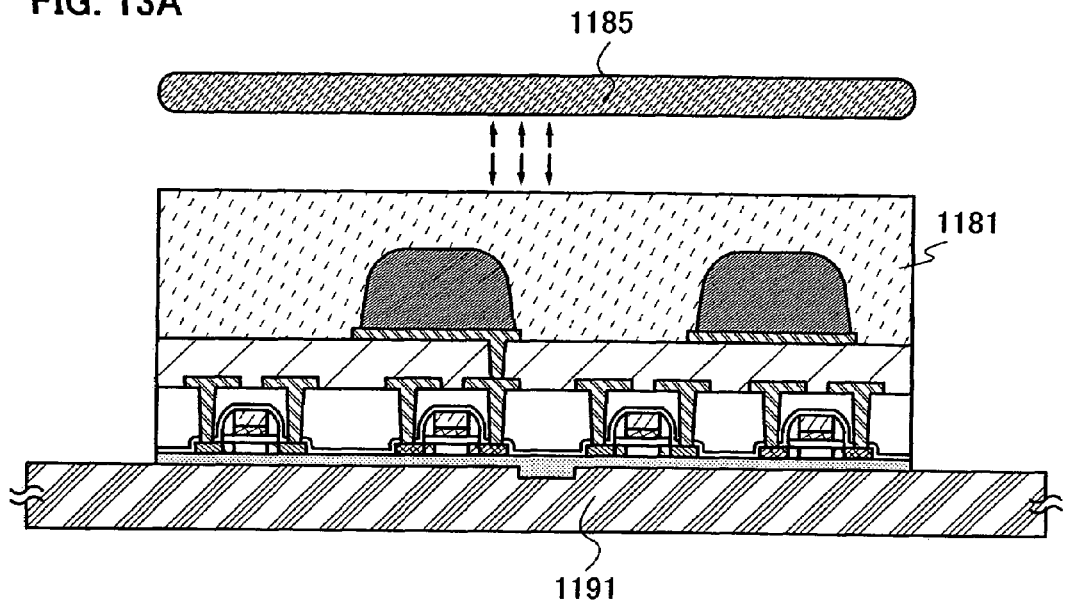
FIGS. 13A and 13B are cross sectional views showing manufacturing steps of a semiconductor device of the invention.

As shown in FIG. 13A, the adhesive 1185 is removed from the insulating layer 1181.

In this embodiment, the adhesive 1185 is removed by irradiation with UV rays.

Figure 13B:
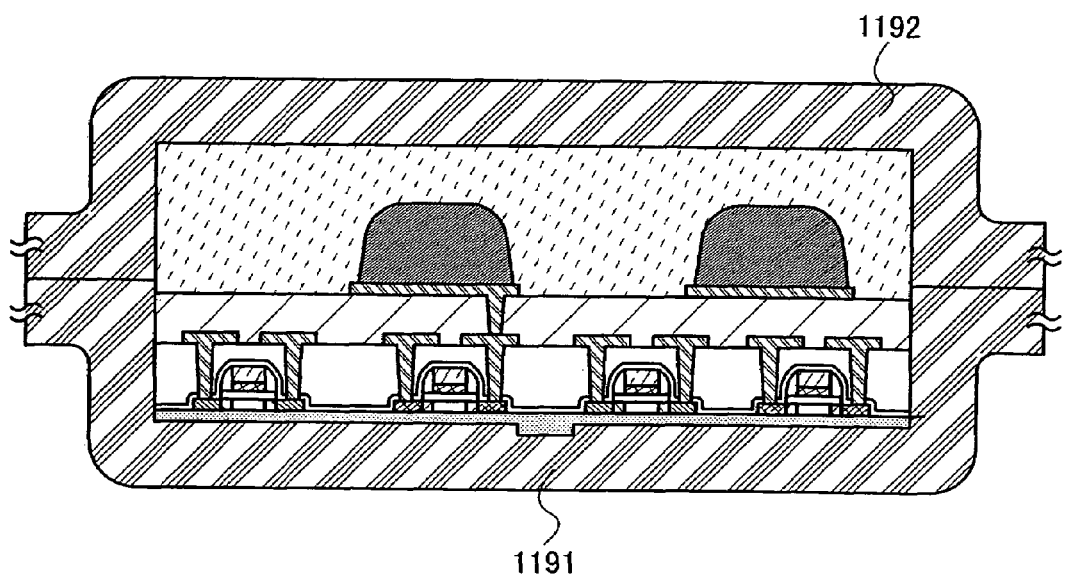

As shown in FIG. 13B, a film 1192 is attached to the film 1191 and the surface of the layer 1170 including the plurality of transistors, thereby sealing the layer 1170 including the plurality of transistors. The film 1192 may be formed of the same material as the film 1191.

In this embodiment, the film 1192 is formed of a sheet material where an adhesive layer, a PET film and silica coat are stacked.

Then, the layers each including a plurality of transistors are cut discretely in the adhesive regions of the films 1191 and 1192. As a result, wireless chips can be obtained.

Embodiment 2

Figure 14:
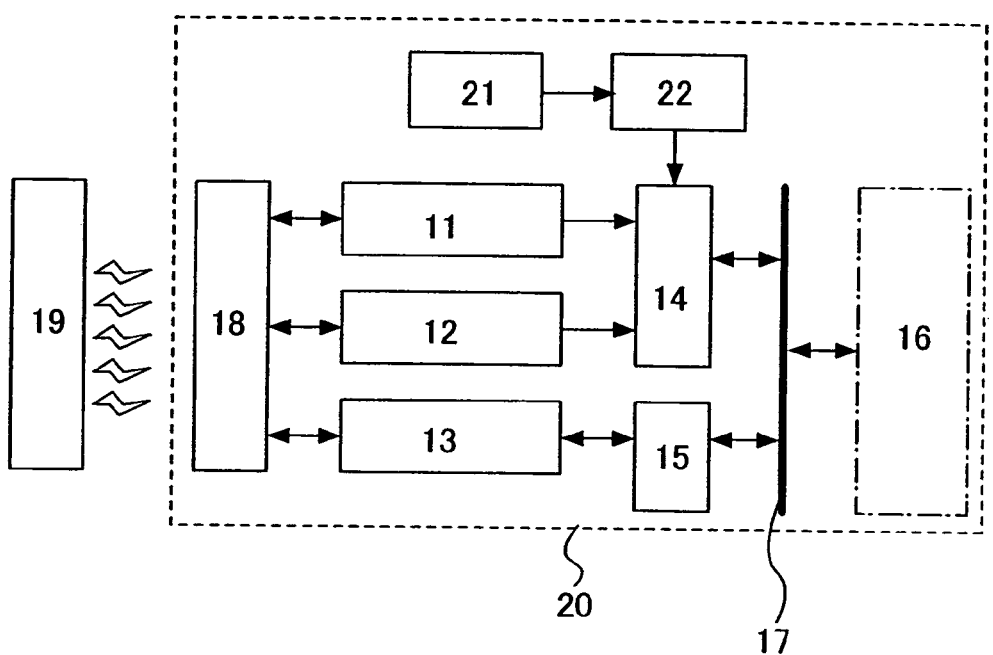
FIG. 14 is a view showing a configuration of a semiconductor device of the invention.

In this embodiment, a configuration of a semiconductor device is described with reference to FIG. 14. As shown in FIG. 14, a semiconductor device 20 of the invention has a function of communicating data wirelessly, and includes a power supply circuit 11, a clock generation circuit 12, a data demodulation/modulation circuit 13, a control circuit 14 for controlling other circuits, an interface circuit 15, a memory circuit 16, a data bus 17, an antenna (antenna coil) 18, a sensor, 21, and a sensor circuit 22.

In the power supply circuit 11, various kinds of voltages to be supplied to each circuit in the semiconductor device 20 are generated in accordance with an AC signal inputted from the antenna 18. In the clock generation circuit 12, various kinds of clock signals to be supplied to each circuit in the semiconductor device 20 are generated in accordance with an AC signal inputted from the antenna 18. The data demodulation/modulation circuit 13 has a function of demodulating/modulating data communicated with a reader/writer 19. The control circuit 14 has a function of controlling the memory circuit 16. The antenna 18 has a function of transmitting/receiving electromagnetic waves. The reader/writer 19 communicates with and controls the semiconductor device, and processes the data of the semiconductor device. Note that the configuration of the semiconductor device is not limited to the aforementioned one, and other elements, for example such as a limiter circuit of a power supply voltage and hardware dedicated to encryption may be additionally provided.

The memory circuit 16 has a memory element where an organic compound layer or a phase change layer is sandwiched between a pair of conductive layers. Note that the memory circuit 16 may have only the memory element where an organic compound layer or a phase change layer is sandwiched between a pair of conductive layers, or may have another memory circuit with a different configuration. The memory circuit with a different configuration corresponds, for example, to one or more of a DRAM, an SRAM, an FeRAM, a mask ROM, a PROM, an EPROM, an EEPROM, and a flash memory.

The sensor 21 includes elements such as a resistor, a capacitive coupling element, an inductive coupling element, a photovoltaic element, a photoelectric converter, a thermal electromotive force element, a transistor, a thermistor, and a diode. The sensor circuit 22 detects changes in impedance, reactance, inductance, voltage, or current, and performs analog/digital (A/D) conversion to output a signal to the control circuit 14.

Embodiment 3

Figure 15A:
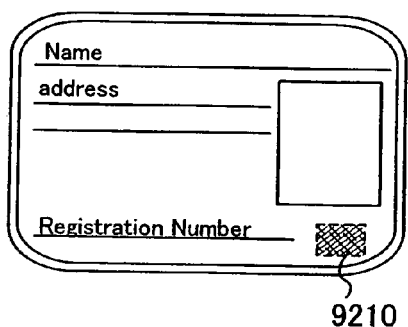
FIGS. 15A to 15F are views showing applications of a semiconductor device of the invention.
Figure 15B:
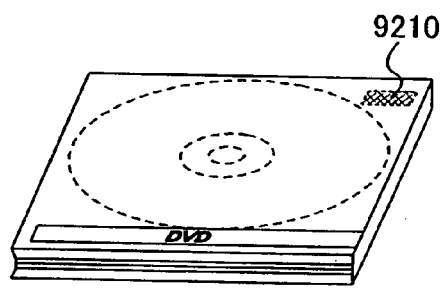
Figure 15C:
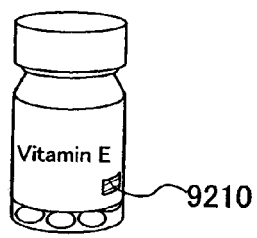
Figure 15D:
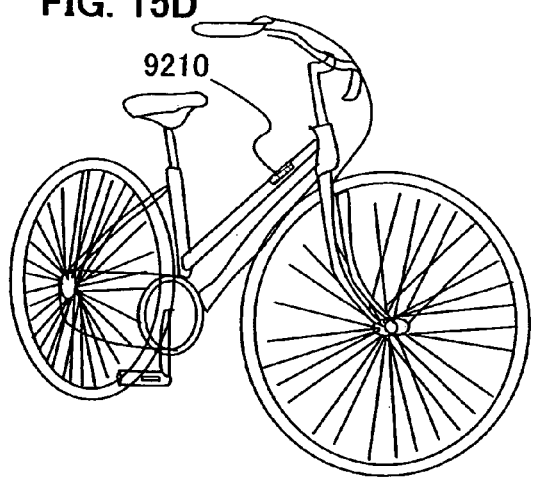
Figure 15E:
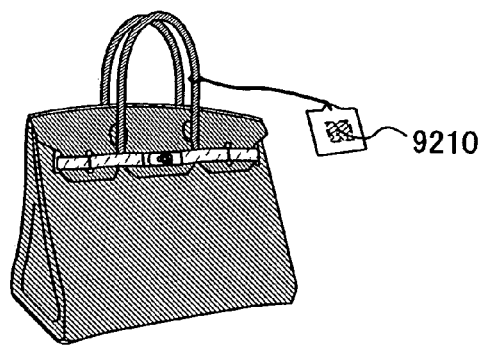
Figure 15F:
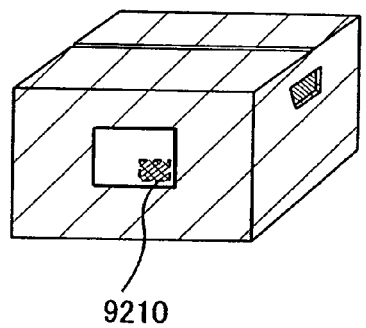
Figure 16A:
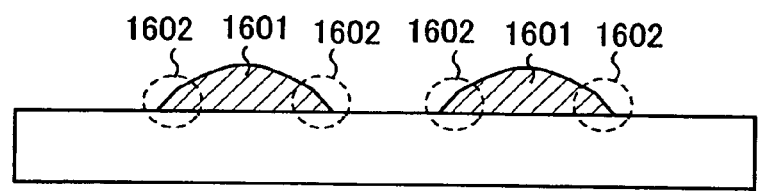
FIGS. 16A and 16B are respectively a cross sectional view and a plan view each showing a structure of a conventional conductive layer.
Figure 16B:
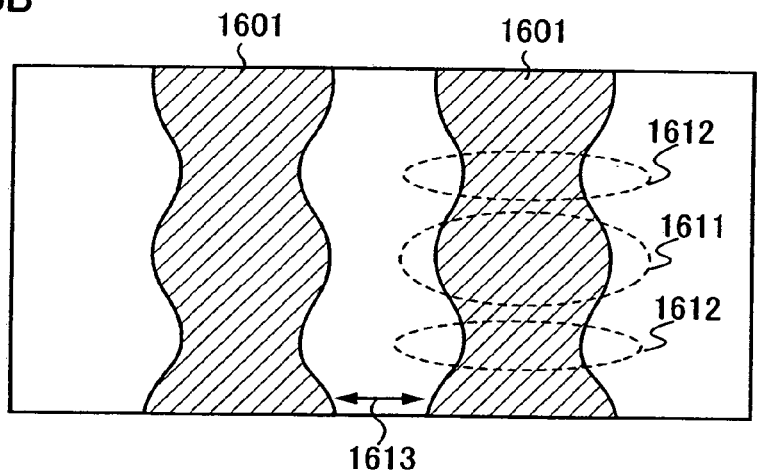

According to the invention, a semiconductor device functioning as a wireless chip (also called a wireless processor, a wireless memory, or a wireless tag) can be obtained. The wireless chip may be mounted on various objects, for example, such as bills, coins, securities, bearer bonds, certificates (licenses, resident cards and the like, see FIG. 15A), containers for wrapping objects (wrapping paper, bottles and the like, see FIG. 15C), recording media (DVDs, video tapes and the like, see FIG. 15B), vehicles (bicycles and the like, see FIG. 15D), personal belongings (bags, glasses and the like), foods, plants, clothes, livingware, and electronic apparatuses, or shipping tags of objects (see FIGS. 15E and 15F). The electronic apparatuses include liquid crystal display devices, EL display devices, television sets (also simply called televisions or television receivers), mobile phones, and the like. The semiconductor device may also be mounted on animals, human body and the like.

A wireless chip is attached to the surface of the object or incorporated in the object to be fixed. For example, a wireless chip may be incorporated in paper of a book, or an organic resin of a package. When a wireless chip is incorporated in bills, coins, securities, bearer bonds, certificates, and the like, forgery thereof can be prevented. In addition, when a wireless chip is incorporated in containers for wrapping objects, recording media, personal belongings, foods, clothes, livingware, electronic apparatuses, and the like, test systems, rental systems and the like can be performed more efficiently. A wireless chip of the invention is obtained in such a manner that a thin film integrated circuit formed over a substrate is separated by a known separation step and then attached to a cover material; therefore, the wireless chip can be reduced in size, thickness and weight and can be mounted on an object while keeping the attractive design. In addition, since such a wireless chip has flexibility, it can be attached to an object having a curved surface, such as bottles and pipes.

When a wireless chip of the invention is applied to product management and distribution system, high performance system can be achieved. For example, when information stored in a wireless chip mounted on a shipping tag is read by a reader/writer provided beside a conveyor belt, information such as distribution process and delivery address is read to easily inspect and distribute the object.

This application is based on Japanese Patent Application serial No. 2004-366595 filed in Japan Patent Office on Dec. 17, 2004, the entire contents of which are hereby incorporated by reference.

What is claimed is:

1. A method of a semiconductor device comprising a conductive layer, comprising:

forming a semiconductor element over a substrate;

forming an inorganic insulating layer over the semiconductor element and exposing a part of a conductive layer connected to one of a source region and a drain region of the semiconductor element;

forming an organic resin layer partially overlapping the inorganic insulating layer and the exposed conductive layer;

forming a low wettability layer with respect to a composition containing a conductive particle on a portion of a surface of the inorganic insulating layer, wherein the portion is not covered by the organic resin layer;

removing the organic resin layer so as to form a high wettability region on the other portion of the surface of the inorganic insulating film;

coating the inorganic insulating layer with the composition containing a conductive particle; and baking the composition containing a conductive particle so that the composition containing the conductive particle contacts with the high wettability region.

2. The method according to claim 1, wherein the composition containing a conductive particle is applied by a droplet discharge method.

3. The method according to claim 1, wherein the composition containing a conductive particle is applied by printing.

4. The method according to claim 3, wherein the printing is screen printing, offset printing, relief printing, or gravure printing.

5. The method according to claim 1, wherein the conductive layer is an antenna.

6. The method according to claim 1, wherein the semiconductor element is a transistor.

7. A method of a semiconductor device comprising a conductive layer, comprising:

forming a semiconductor element over a substrate;

forming an inorganic insulating layer over the semiconductor element and exposing a part of a conductive layer connected to one of a source region and a drain region of the semiconductor element;

forming an organic resin layer partially overlapping the inorganic insulating layer and the exposed conductive layer;

forming a low wettability layer with respect to a composition containing a conductive particle on a portion of a surface of the inorganic insulating layer, wherein the portion is not covered by the organic resin layer;

removing the organic resin layer so as to form a high wettability region on the other portion of the surface of the inorganic insulating film;

coating the inorganic insulating layer with the composition containing a conductive particle; and baking the composition containing a conductive particle so that the composition containing the conductive particle contacts with the high wettability region, wherein the inorganic insulating film comprises at least two layers.

8. The method according to claim 7, wherein the composition containing a conductive particle is applied by a droplet discharge method.

9. The method according to claim 7, wherein the composition containing a conductive particle is applied by printing.

10. The method according to claim 9, wherein the printing is screen printing, offset printing, relief printing, or gravure printing.

11. The method according to claim 7, wherein the conductive layer is an antenna.

12. The method according to claim 7, wherein the semiconductor element is a transistor.

13. A method of a semiconductor device comprising a conductive layer, comprising:

forming a semiconductor element over a substrate;

forming an inorganic insulating layer over the semiconductor element and exposing a part of a conductive layer connected to one of a source region and a drain region of the semiconductor element;

forming an organic resin layer partially overlapping the inorganic insulating layer and the exposed conductive layer;

forming a low wettability layer with respect to a composition containing a conductive particle on a portion of a surface of the inorganic insulating layer, wherein the portion is not covered by the organic resin layer;

removing the organic resin layer so as to form a high wettability region on the other portion of the surface of the inorganic insulating film;

coating the inorganic insulating layer with the composition containing a conductive particle; and baking the composition containing a conductive particle so that the composition containing the conductive particle contacts with the exposing the part of the conductive layer and the high wettability region;

wherein the inorganic insulating film comprises at least two layers.

14. The method according to claim 13, wherein the composition containing a conductive particle is applied by a droplet discharge method.

15. The method according to claim 14, wherein the conductive layer is an antenna.

16. The method according to claim 14, wherein the semiconductor element is a transistor.

17. The method according to claim 14, wherein the composition containing a conductive particle is applied by printing.

18. The method according to claim 17, wherein the printing is screen printing, offset printing, relief printing, or gravure printing.

* * * * *